United States Patent
Tak et al.

(10) Patent No.: US 10,529,555 B2
(45) Date of Patent: *Jan. 7, 2020

(54) METHODS OF FABRICATING A SIOCN LAYER USING A FIRST AND SECOND CARBON PRECURSOR, THE FIRST CARBON PRECURSOR BEING DIFFERENT FROM THE SECOND CARBON PRECURSOR

(71) Applicant: SAMSUNG ELECTRONICS CO., LTD., Suwon-si, Gyeonggi-do (KR)

(72) Inventors: Yong-suk Tak, Seoul (KR); Tae-jong Lee, Hwaseong-si (KR); Bon-young Koo, Suwon-si (KR); Ki-yeon Park, Hwaseong-si (KR); Sung-hyun Choi, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,375

(22) Filed: May 24, 2019

(65) Prior Publication Data

US 2019/0287797 A1     Sep. 19, 2019

Related U.S. Application Data

(63) Continuation of application No. 15/296,220, filed on Oct. 18, 2016.

(30) Foreign Application Priority Data

Oct. 22, 2015  (KR) .................. 10-2015-0147540

(51) Int. Cl.
*H01L 21/02*  (2006.01)
*C23C 16/30*  (2006.01)
(Continued)

(52) U.S. Cl.
CPC ........ *H01L 21/02211* (2013.01); *C23C 16/30* (2013.01); *C23C 16/45531* (2013.01);
(Continued)

(58) Field of Classification Search
CPC ......... H01L 21/02126; H01L 21/02211; H01L 21/02274; H01L 21/0228; H01L 21/28088; C23C 16/45531; C23C 16/45536
See application file for complete search history.

(56) References Cited

U.S. PATENT DOCUMENTS

| | | | |
|---|---|---|---|
| 2010/0092781 | A1 | 4/2010 | Zambov et al. |
| 2010/0092782 | A1 | 4/2010 | Perrier et al. |
| 2010/0129994 | A1 | 5/2010 | Awad et al. |
| 2013/0252435 | A1 | 9/2013 | Shimamoto et al. |

(Continued)

FOREIGN PATENT DOCUMENTS

| | | |
|---|---|---|
| JP | 2002-530890 A | 9/2002 |
| JP | 2014-216342 A | 11/2014 |

(Continued)

*Primary Examiner* — Michael Jung
(74) *Attorney, Agent, or Firm* — Lee & Morse, P.C.

(57) ABSTRACT

A method of forming a SiOCN material layer, a material layer stack, a semiconductor device, a method of fabricating a semiconductor device, and a deposition apparatus, the method of forming a SiOCN material layer including providing a substrate; providing a silicon precursor onto the substrate; providing an oxygen reactant onto the substrate; providing a first carbon precursor onto the substrate; providing a second carbon precursor onto the substrate; and providing a nitrogen reactant onto the substrate, wherein the first carbon precursor and the second carbon precursor are different materials.

18 Claims, 28 Drawing Sheets

(51) Int. Cl.
  *H01L 29/66* (2006.01)
  *H01L 29/49* (2006.01)
  *H01L 27/11* (2006.01)
  *H01L 27/092* (2006.01)
  *C23C 16/455* (2006.01)
  *H01L 29/78* (2006.01)

(52) U.S. Cl.
  CPC .... *C23C 16/45536* (2013.01); *H01L 21/0228* (2013.01); *H01L 21/02126* (2013.01); *H01L 21/02216* (2013.01); *H01L 21/02274* (2013.01); *H01L 27/0924* (2013.01); *H01L 27/1104* (2013.01); *H01L 27/1116* (2013.01); *H01L 29/4966* (2013.01); *H01L 29/4983* (2013.01); *H01L 29/66545* (2013.01); *H01L 29/66795* (2013.01); *H01L 29/785* (2013.01); *H01L 29/7854* (2013.01)

(56) References Cited

U.S. PATENT DOCUMENTS

| | | |
|---|---|---|
| 2014/0287596 A1 | 9/2014 | Hirose et al. |
| 2014/0315393 A1 | 10/2014 | Ozaki et al. |
| 2014/0356549 A1 | 12/2014 | Varadarajan |
| 2015/0118865 A1 | 4/2015 | Shimizu |
| 2016/0002039 A1 | 1/2016 | Thompson |
| 2016/0086791 A1 | 3/2016 | Sano et al. |
| 2016/0097126 A1* | 4/2016 | Kogura ............. H01L 21/02126 |
| 2016/0365246 A1* | 12/2016 | Yamamoto ............. C23C 16/02 |
| 2017/0051408 A1* | 2/2017 | Takagi ............. C23C 16/45563 |
| 2017/0140924 A1 | 5/2017 | Suzuki et al. |

FOREIGN PATENT DOCUMENTS

| | | |
|---|---|---|
| KR | 10-2014-0126241 A | 10/2014 |
| KR | 10-2014-0141533 A | 12/2014 |

* cited by examiner

METHODS OF FABRICATING A SIOCN LAYER USING A FIRST AND SECOND CARBON PRECURSOR, THE FIRST CARBON PRECURSOR BEING DIFFERENT FROM THE SECOND CARBON PRECURSOR

CROSS-REFERENCE TO RELATED PATENT APPLICATIONS

This is a continuation application based on pending application Ser. No. 15/296,220, filed Oct. 18, 2016, the entire contents of which is hereby incorporated by reference.

Korean Patent Application No. 10-2015-0147540, filed on Oct. 22, 2015, in the Korean Intellectual Property Office, and entitled: "Material Layer, Semiconductor Device Including the Same, and Methods of Fabricating the Material Layer and the Semiconductor Device," is incorporated by reference herein in its entirety.

BACKGROUND

1. Field

Embodiments relate to a material layer, a semiconductor device including the material layer, and methods of fabricating the material layer and the semiconductor device.

2. Description of the Related Art

A material used to obtain a minute pattern may be sensitive to high temperatures, and a low-temperature process may be desirable.

SUMMARY

Embodiments are directed to a material layer, a semiconductor device including the material layer, and methods of fabricating the material layer and the semiconductor device.

The embodiments may be realized by providing a method of forming a SiOCN material layer, the method including providing a substrate; providing a silicon precursor onto the substrate; providing an oxygen reactant onto the substrate; providing a first carbon precursor onto the substrate; providing a second carbon precursor onto the substrate; and providing a nitrogen reactant onto the substrate, wherein the first carbon precursor and the second carbon precursor are different materials.

The first carbon precursor and the second carbon precursor may each independently be an alkane having a carbon number of 1 to 10, an alkene having a carbon number of 2 to 10, an alkylamine having a carbon number of 1 to 15, a nitrogen-containing heterocyclic compound having a carbon number of 4 to 15, an alkylsilane having a carbon number of 1 to 20, an alkoxysilane having a carbon number of 1 to 20, or an alkylsiloxane having a carbon number of 1 to 20.

At least one of the first carbon precursor and the second carbon precursor may include an alkylamine having a carbon number of 1 to 15 or a nitrogen-containing heterocyclic compound having a carbon number of 4 to 15; or an alkylsilane having a carbon number of 1 to 20, alkoxysilane having a carbon number of 1 to 20, or alkylsiloxane having a carbon number of 1 to 20.

The method may be performed at 600° C. or less.

The nitrogen reactant and the second carbon precursor may be the same material, and providing the nitrogen reactant and providing the second carbon precursor may be performed simultaneously.

Providing the silicon precursor, providing the oxygen reactant, providing the first carbon precursor, and providing the second carbon precursor may be included in a single cycle.

The first carbon precursor may include an alkane having a carbon number of 1 to 10, an alkene having a carbon number of 2 to 10, an alkylsilane having a carbon number of 1 to 20, an alkoxysilane having a carbon number of 1 to 20, or an alkylsiloxane having a carbon number of 1 to 20, and the second carbon precursor may include an alkylamine having a carbon number of 1 to 15 or a nitrogen-containing heterocyclic compound having a carbon number of 4 to 15.

The first carbon precursor may include an alkylsilane having a carbon number of 1 to 20, an alkoxysilane having a carbon number of 1 to 20, or an alkylsiloxane having a carbon number of 1 to 20.

The silicon precursor and the first carbon precursor may include the same material, and providing the silicon precursor and providing the first carbon precursor may be performed simultaneously.

Providing the first carbon precursor, providing the oxygen reactant, and providing the second carbon precursor may be included in a single cycle.

The first carbon precursor may include an alkylsilane having a carbon number of 1 to 20, an alkoxysilane having a carbon number of 1 to 20, or an alkylsiloxane having a carbon number of 1 to 20, and the second carbon precursor may include an alkylamine having a carbon number of 1 to 15 or a nitrogen-containing heterocyclic compound having a carbon number of 4 to 15.

The method may be performed at 500° C. or less.

The silicon precursor and the second carbon precursor may be the same material, and providing the silicon precursor and providing the second carbon precursor may be performed simultaneously.

Providing the silicon precursor, providing the oxygen reactant, providing the first carbon precursor, and providing the nitrogen reactant may be included in a single cycle.

The first carbon precursor may include an alkylsilane having a carbon number of 1 to 20, an alkoxysilane having a carbon number of 1 to 20, or an alkylsiloxane having a carbon number of 1 to 20, and the second carbon precursor may include an alkane having a carbon number of 1 to 10, an alkene having a carbon number of 2 to 10, an alkylamine having a carbon number of 1 to 15, or a nitrogen-containing heterocyclic compound having a carbon number of 4 to 15.

The embodiments may be realized by providing a material layer stack including a semiconductor substrate; and a SiOCN material layer formed over the semiconductor substrate, wherein the SiOCN material layer includes about 10 atom % to about 30 atom % of carbon, and about 25 atom % to about 50 atom % of oxygen.

The SiOCN material layer may include about 11 atom % to about 20 atom % of carbon.

The SiOCN material layer may include about 30 atom % to about 48 atom % of oxygen.

A dielectric constant of the SiOCN material layer may be greater than or equal to 1 and less than 5.0.

The dielectric constant of the SiOCN material layer may be greater than or equal to 1 and less than 4.8.

The dielectric constant of the SiOCN material layer may be greater than or equal to 1 and less than 4.4.

The material layer stack may further include a $SiO_2$ layer between the semiconductor substrate and the SiOCN material layer.

The embodiments may be realized by providing a semiconductor device including a semiconductor substrate; an isolation layer defining an active area of the semiconductor substrate; a gate electrode on the active area; a spacer on a sidewall of the gate electrode, the spacer including a lower end closest to the active area among ends of the spacer and an upper end farthest from the active area among ends of the spacer; and impurity regions on opposite sides of the gate electrode, wherein at a height equal to 75% of an overall height of the spacer from the lower end, a thickness of the spacer is equal to or greater than 0.4 times a thickness of the lower end of the spacer, and the spacer includes a SiOCN material layer.

A dielectric constant of the SiOCN material layer of the spacer may be less than 5.0.

The SiOCN material layer of the spacer may include about 10 atom % to about 30 atom % of carbon, and about 25 atom % to about 50 atom % of oxygen.

The active area may be a fin-type active area that protrudes from the semiconductor substrate and extends in a first direction, and the gate electrode may extend on the active area in a direction intersecting with the first direction.

The gate electrode may intersect the active area and covers two opposite sidewalls of the active area and an upper surface of the active area between the two sidewalls.

At a height equal to 50% of the overall height of the spacer from the lower end, a thickness of the spacer may be equal to or greater than 0.8 times the thickness of the lower end of the spacer.

The spacer may have an upper surface that is at least partially flat.

The upper surface of the spacer may be at least partially located on the same plane as an upper surface of the gate electrode.

The embodiments may be realized by providing a method of fabricating a semiconductor device, the method including defining a fin-type active area that protrudes from a semiconductor substrate and extends in a first direction; forming a gate electrode that covers two sidewalls and an upper surface of the fin-type active area, the gate electrode extending in a direction that intersects the first direction; forming a spacer on a sidewall of the gate electrode; and forming impurity regions in the active area respectively on opposite sides of the gate electrode, wherein forming the spacer includes forming a SiOCN material layer.

Forming the SiOCN material layer may include providing a first carbon precursor onto the substrate; and providing a second carbon precursor onto the substrate, and the first carbon precursor and the second carbon precursor may be different materials.

The first carbon precursor may include an alkylsilane having a carbon number of 1 to 20, an alkoxysilane having a carbon number of 1 to 20, or an alkylsiloxane having a carbon number of 1 to 20, and the second carbon precursor may include an alkylamine having a carbon number of 1 to 15 or a nitrogen-containing heterocyclic compound having a carbon number of 4 to 15.

The method may further include forming a dummy gate electrode, before the forming of the spacer, wherein forming the spacer includes forming a spacer on a sidewall of the dummy gate electrode; and removing the dummy gate electrode after the forming of the spacer, wherein forming the gate electrode is performed after the removing of the dummy gate electrode.

The embodiments may be realized by providing a deposition apparatus including a reaction chamber that defines a reaction space; a support that supports a substrate; a first transfer line to introduce a first carbon precursor into the reaction space; a second transfer line to introduce a second carbon precursor into the reaction space; and electrodes to generate a potential to generate plasma within the reaction space, wherein the first carbon precursor and the second carbon precursor are different materials, and the first transfer line and the second transfer line join together in the reaction space.

The support may include a temperature controller to control a temperature of the substrate to 600° C. or less.

The embodiments may be realized by providing a method of forming a SiOCN material layer, the method including providing a substrate; providing an oxygen reactant onto the substrate; providing a first carbon precursor onto the substrate; and providing a second carbon precursor onto the substrate, wherein the first carbon precursor and the second carbon precursor are different materials, and the method is performed at a temperature 600° C. or lower.

The method may further include providing a silicon precursor onto the substrate, wherein the silicon precursor is different from the first carbon precursor.

The method may further include providing a nitrogen reactant onto the substrate, wherein the nitrogen reactant is different from the second carbon precursor.

The first carbon precursor may include an alkane having a carbon number of 1 to 10, an alkene having a carbon number of 2 to 10, an alkylamine having a carbon number of 1 to 15, a nitrogen-containing heterocyclic compound having a carbon number of 4 to 15, an alkylsilane having a carbon number of 1 to 20, an alkoxysilane having a carbon number of 1 to 20, or an alkylsiloxane having a carbon number of 1 to 20, and the second carbon precursor may include an alkane having a carbon number of 1 to 10, an alkene having a carbon number of 2 to 10, an alkylamine having a carbon number of 1 to 15, a nitrogen-containing heterocyclic compound having a carbon number of 4 to 15, an alkylsilane having a carbon number of 1 to 20, an alkoxysilane having a carbon number of 1 to 20, or an alkylsiloxane having a carbon number of 1 to 20.

The first carbon precursor may include an alkylsilane having a carbon number of 1 to 20, an alkoxysilane having a carbon number of 1 to 20, or an alkylsiloxane having a carbon number of 1 to 20.

The second carbon precursor may include an alkylamine having a carbon number of 1 to 15 or a nitrogen-containing heterocyclic compound having a carbon number of 4 to 15.

The SiOCN material layer may include about 10 atom % to about 30 atom % of carbon, and about 25 atom % to about 50 atom % of oxygen.

A dielectric constant of the SiOCN material layer may be 1 to 5.

The embodiments may be realized by providing a method of fabricating a semiconductor device, the method including defining a fin-type active area that protrudes from a semiconductor substrate and extends in a first direction; forming a gate electrode that covers two sidewalls and an upper surface of the fin-type active area, the gate electrode extending in a direction that intersects the first direction; forming a spacer on a sidewall of the gate electrode; and forming impurity regions in the active area respectively on opposite sides of the gate electrode, wherein forming the spacer includes forming a SiOCN material layer according to an embodiment.

The embodiments may be realized by providing a material layer stack including a semiconductor substrate; and a SiOCN material layer formed over the semiconductor substrate according to an embodiment, wherein the SiOCN material layer includes about 10 atom % to about 30 atom % of carbon, and about 25 atom % to about 50 atom % of oxygen.

The embodiments may be realized by providing a semiconductor device including a semiconductor substrate; an isolation layer defining an active area of the semiconductor substrate; a gate electrode on the active area; a spacer on a sidewall of the gate electrode, the spacer including a lower end closest to the active area among ends of the spacer and an upper end farthest from the active area among ends of the spacer; and impurity regions on opposite sides of the gate electrode, wherein at a height equal to 75% of an overall height of the spacer from the lower end, a thickness of the spacer is equal to or greater than 0.4 times a thickness of the lower end of the spacer, and the spacer includes a SiOCN material layer prepared according to the method of an embodiment.

The embodiments may be realized by providing a deposition apparatus for performing the method according to an embodiment, the apparatus including a reaction chamber that defines a reaction space; a support that supports the substrate; a first transfer line to introduce the first carbon precursor into the reaction space; a second transfer line to introduce the second carbon precursor into the reaction space; and electrodes to generate a potential to generate plasma within the reaction space, wherein the first transfer line and the second transfer line join together in the reaction space.

BRIEF DESCRIPTION OF THE DRAWINGS

Features will be apparent to those of skill in the art by describing in detail exemplary embodiments with reference to the attached drawings in which:

FIG. 8A illustrates a plan view of the semiconductor device, FIG. 8B illustrates a perspective view of the semiconductor device, FIG. 8C illustrates a lateral cross-sectional view of the semiconductor device, and FIG. 8D illustrates a magnified cross-sectional view of a gate structure of the semiconductor device and a structure adjacent to the gate structure;

DETAILED DESCRIPTION

Figure 1:
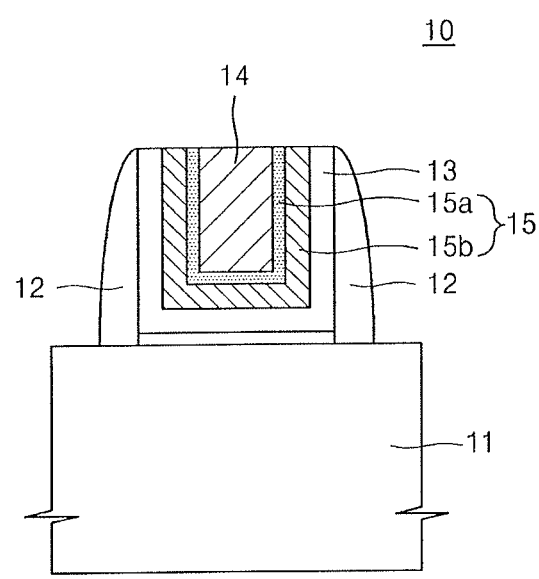
FIG. 1 illustrates a lateral cross-sectional view of a material layer stack including a semiconductor substrate and a SiOCN material layer formed on the semiconductor substrate, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. For example, the term "or" is not exclusive, and may be understood as having the same meaning as "and/or." Expressions such as "at least one of," when preceding a list of elements, modify the entire list of elements and do not modify the individual elements of the list.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

The terminology used herein is for the purpose of describing particular embodiments only, and is not intended to be limiting. An expression used in the singular encompasses the expression in the plural, unless it has a clearly different meaning in the context. It will be understood that the terms, e.g., "comprises," "includes," "including," and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The embodiments are not limited to the described order of the operations. For example, two consecutively described processes may be performed substantially at the same time or performed in an order opposite to the described order.

As such, variations from the shapes of the illustrations as a result, for example, of manufacturing techniques and/or tolerances, are to be expected. Thus, embodiments should not be construed as being limited to the particular shapes of regions illustrated herein but are to include deviations in shapes that result, for example, from manufacturing. The term "substrate" used in this specification may mean a substrate itself, or a stacked structure including a substrate and a layer or film formed on a surface of the substrate. The term "a surface of a substrate" used in this specification may mean an exposed surface of a substrate or an outer surface of a layer or film formed on the substrate.

An embodiment may provide a material layer stack including a semiconductor substrate and a SiOCN material layer formed on the semiconductor substrate.

FIG. 1 illustrates a lateral cross-sectional view of a material layer stack 10 including a semiconductor substrate 11 and a SiOCN material layer 12 formed on the semiconductor substrate 11, according to an embodiment.

Referring to FIG. 1, the semiconductor substrate 11 may be formed of, e.g., at least one of a Group III and V element-containing material and a Group IV element-containing material. The Group III and V element-containing material may be a binary, ternary, or quaternary compound including at least one Group III element and at least one Group V element. The Group III and V elements-containing material may be a compound including, as a Group III element, at least one of In, Ga, and Al and, as a Group V element, at least one of As, P, and Sb. For example, the Group III and V elements-containing material may be selected from InP, $In_zGa_{1-z}As$ (0≤z≤1), and $Al_zGa_{1-z}As$ (0≤z≤1). The binary compound may include, e.g., one of InP, GaAs, InAs, InSb and GaSb. The ternary compound may be one of InGaP, InGaAs, AlInAs, InGaSb, GaAsSb, and GaAsP. The Group IV element-containing material may include, e.g., Si and/or Ge. In an implementation, the material may include a suitable Group III and V element-containing material and a suitable Group IV element-containing material that are usable to form a thin film.

The Group III and V element-containing material, and the Group IV element-containing material, e.g., Ge, may each be used as a channel material capable of forming a low-power and high-speed transistor. A high-performance CMOS may be formed using a semiconductor substrate formed of a Group III and V element-containing material, e.g., GaAs, having higher mobility of electrons than a Si substrate, and a SiGe semiconductor substrate including a semiconductor material, e.g., Ge, having higher mobility of holes than a Si substrate. According to some embodiments, when an N-type channel is intended to be formed on the semiconductor substrate 11, the semiconductor substrate 11 may be formed of one of the above-exemplified Group III and V element-containing materials or may be formed of SiC. According to some other embodiments, when a P-type channel is intended to be formed on the semiconductor substrate 11, the semiconductor substrate 11 may be formed of SiGe.

The SiOCN material layer 12 may be a material layer containing silicon (Si), oxygen (O), carbon (C), and nitrogen (N). In an implementation, the SiOCN material layer 12 may include carbon in an amount of, e.g., about 10 atom % to about 30 atom %. In an implementation, the SiOCN material layer 12 may include carbon in an amount of, e.g., about 11 atom % to about 20 atom %.

In an implementation, the SiOCN material layer 12 may include oxygen in an amount of, e.g., about 25 atom % to about 50 atom %. In an implementation, the SiOCN material layer 12 may include oxygen in an amount of, e.g., about 30 atom % to about 48 atom %.

In an implementation, the SiOCN material layer 12 may include carbon in an amount of, e.g., about 10 atom % to about 30 atom % and oxygen in an amount of, e.g., about 25 atom % to about 50 atom %.

In an implementation, the SiOCN material layer 12 may have a dielectric constant that is, e.g., greater than or equal to 1 and less than 5.0. In an implementation, the SiOCN material layer 12 may have a dielectric constant that is greater than or equal to 1 and less than 4.8. In an implementation, the SiOCN material layer 12 may have a dielectric constant that is greater than or equal to 1 and less than 4.4. The dielectric constant may vary depending on the composition of the SiOCN material layer 12.

The SiOCN material layer 12 may be provided directly on the semiconductor substrate 11 or may be provided on the semiconductor substrate 11 with another material layer interposed between the SiOCN material layer 12 and the semiconductor substrate 11. In an implementation, the SiOCN material layer 12 may be stacked on the semiconductor substrate 11 with an insulation layer interposed therebetween. In an implementation, the SiOCN material layer 12 may be stacked on the semiconductor substrate 11 with a, e.g., $HfO_2$, $ZrO_2$, $HfSiO_x$, $TaSiO_x$, or $LaO_x$ layer interposed therebetween.

In an implementation, a thickness of the SiOCN material layer 12 may not be constant, as illustrated in FIG. 1. In an implementation, the SiOCN material layer 12 may have a substantially constant thickness.

In an implementation, the SiOCN material layer 12 may be formed on a metal material layer 14. The metal material layer 14 may include, e.g., titanium (Ti), tungsten (W), aluminum (Al), ruthenium (Ru), niobium (Nb), hafnium (Hf), nickel (Ni), cobalt (Co), platinum (Pt), ytterbium (Yb), terbium (Tb), dysprosium (Dy), erbium (Er), and/or palladium (Pd).

In an implementation, the SiOCN material layer 12 may be formed on carbide, nitride, silicide, or aluminum carbide of the metals that constitute the metal material layer 14, or on a combination thereof.

In an implementation, the SiOCN material layer 12 may be formed directly on the metal material layer 14 or may be provided on the metal material layer 14 with a material layer different from the SiOCN material layer 12 interposed therebetween.

In an implementation, the SiOCN material layer 12 may be provided on the metal material layer 14 with a high-k material layer 13 interposed therebetween. The high-k material layer 13 may be formed of a material having a dielectric constant of, for example, about 10 atom % to about 25 atom %. In an implementation, the high-k material layer 13 may include, e.g., hafnium oxide, hafnium oxynitride, hafnium silicon oxide, lanthanum oxide, lanthanum aluminum oxide, lanthanum silicon oxide, zirconium oxide, zirconium silicon oxide, tantalum oxide, tantalum hafnium oxide, tantalum aluminum oxide, tantalum silicon oxide, tantalum zirconium oxide, titanium oxide, titanium aluminum oxide, barium strontium titanium oxide, barium titanium oxide, strontium titanium oxide, yttrium oxide, erbium oxide, dysprosium oxide, gadolinium oxide, gallium oxide, aluminum oxide, aluminum silicon oxide, silicon germanium oxide, lead scandium tantalum oxide, lead zinc niobate, or a combination thereof.

In an implementation, the SiOCN material layer 12 may be provided on the metal material layer 14 with a physical property adjustment functional layer 15 interposed therebetween. In an implementation, the physical property adjustment functional layer 15 may include a barrier metal layer 15a and a work function adjustment layer 15b.

The work function adjustment layer 15b may be an N-type or P-type work function adjustment layer. When the work function adjustment layer 15b is an N-type work function adjustment layer, the work function adjustment layer 15b may include, e.g., TiAl, TiAlN, TaC, TiC, and/or HfSi. When the work function adjustment layer 15b is a P-type work function adjustment layer, the work function adjustment layer 15b may include, e.g., Mo, Pd, Ru, Pt, TiN, WN, TaN, Ir, TaC, RuN, or MoN.

The barrier metal layer 15a may be, for example, TiN.

A method of fabricating a material layer stack will now be described.

Figure 2:
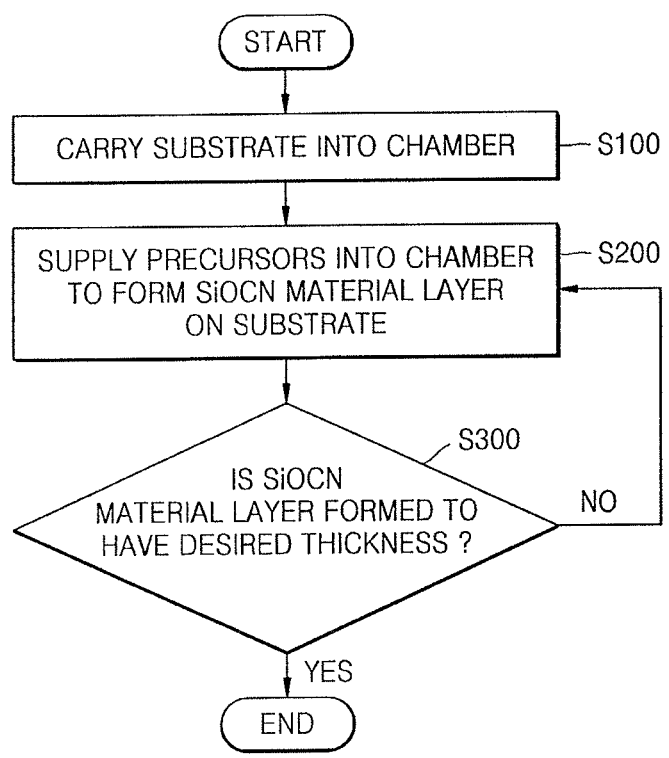
FIG. 2 illustrates a flowchart of a method of fabricating the material layer stack, according to an embodiment.

FIG. 2 illustrates a flowchart of a method of fabricating the material layer stack, according to an embodiment.

Referring to FIG. 2, a substrate may be carried into a reaction space such as a chamber, in operation S100. To form a SiOCN material layer on the substrate, precursors may be supplied into the reaction space, in operation S200. Then, in operation S300, when the SiOCN material layer is formed to have a desired thickness, the substrate may be carried out of the reaction space.

Formation of the SiOCN material layer on the substrate in operation S200 may be performed using a suitable method. In an implementation, the SiOCN material layer may be formed by chemical vapor deposition (CVD). In an implementation, the SiOCN material layer may be formed by atomic layer deposition (ALD). For example, the SiOCN material layer may be formed by plasma enhanced ALD (PEALD).

Formation of the SiOCN material layer on the substrate by PEALD will now be described. In an implementation, the SiOCN material layer may be formed using another suitable method.

Figure 3:
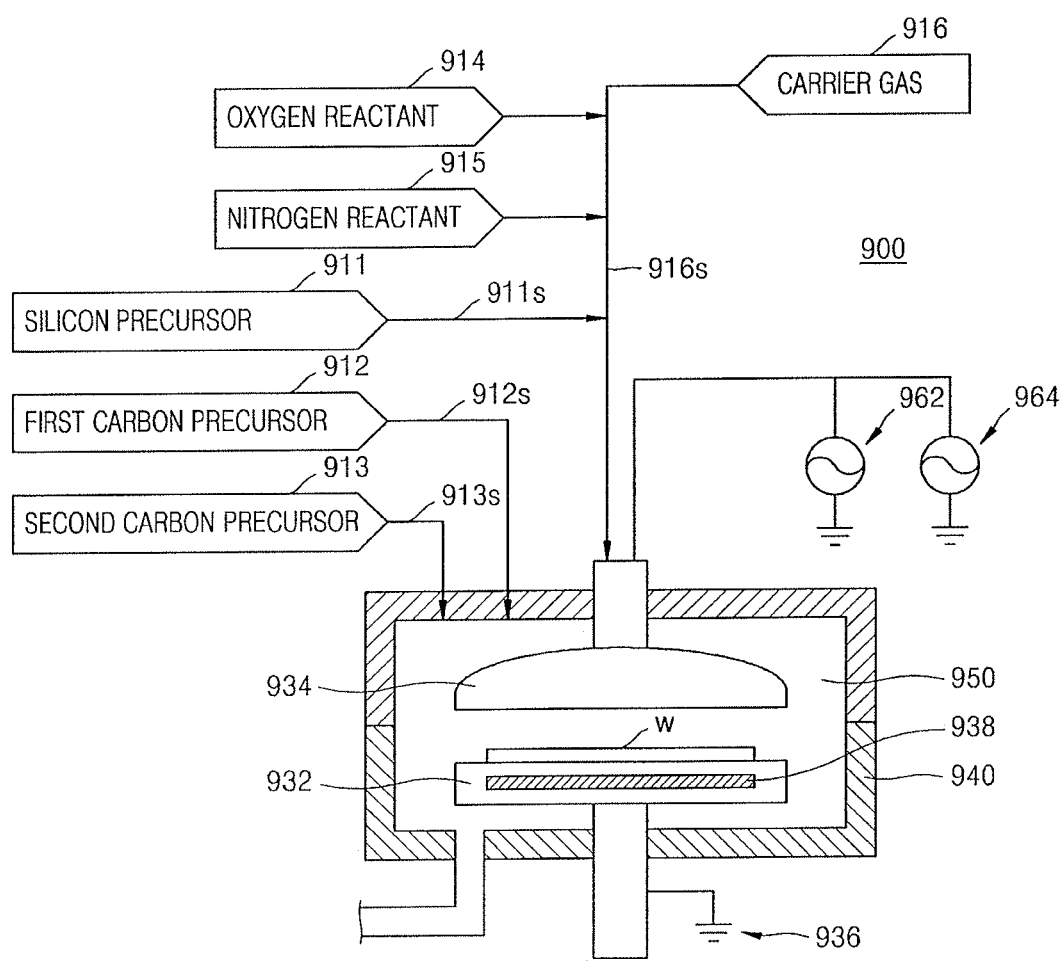
FIG. 3 illustrates a conceptual diagram of plasma enhanced atomic layer deposition (PEALD) equipment for forming the SiOCN material layer, according to an embodiment.

FIG. 3 illustrates a conceptual diagram of PEALD equipment 900 for forming the SiOCN material layer, according to an embodiment.

Referring to FIG. 3, a pair of conductive flat panel electrodes 932 and 934 facing each other and extending in parallel may be provided within a reaction space 950, which is the inside of a reaction chamber 940. 13.56 MHz or 27 MHz HRF power 962 (and LRF power 964 of no more than 5 MHz (400 kHz to 500 kHz) as needed) may be applied to one of the conductive flat panel electrodes 932 and 934, and the other electrode may be electrically grounded as indicated by reference numeral 936. Thus, plasma may be excited between the conductive flat panel electrodes 932 and 934.

A lower electrode 932 may serve as a support that supports a substrate W, and a temperature controller 938 may be built into the lower electrode 932 to maintain the substrate W at a constant temperature. For example, as will be described in detail below, according to embodiments, a SiOCN material layer may be able to be deposited with high oxygen and carbon contents at a relatively low temperature, e.g., about 600° C. or less. In an implementation, the SiOCN material layer may be deposited with high oxygen and carbon contents even at about 500° C. or less, which is an even lower temperature, according to the type of carbon precursor used. In an implementation, the temperature controller 938 may be configured to control a temperature of the substrate W to 600° C. or less, e.g., 500° C. or less.

An upper electrode 934 may serve as, e.g., a shower head, as well as an electrode. In an implementation, several gases (including a process gas) may be introduced into the reaction space 950 via the upper electrode 934. In an implementation, some gases may be introduced into the reaction space 950 via respective unique pipes of the gases.

A carrier gas 916 may convey different precursors and/or reactants to the reaction space 950. In an implementation, the carrier gas 916 may purge an unreacted material or reaction by-products within the reaction space 950.

In an implementation, the carrier gas 916 may be, e.g., an inert gas such as helium (He) or neon (Ne), or an extremely-low active gas such as nitrogen ($N_2$) or carbon dioxide ($CO_2$).

A silicon precursor 911 may be introduced into the reaction space 950 via a silicon precursor supply line 911s. In an implementation, the silicon precursor supply line 911s may be joined to a carrier gas supply line 916s.

In an implementation, a supply line of the carrier gas 916 may be connected to supply lines of the silicon precursor 911, an oxygen reactant 914, and a nitrogen reactant 915 as illustrated in FIG. 3. In an implementation, the supply line of the carrier gas 916 may be connected to a supply line of a first carbon precursor 912 or a supply line of a second carbon precursor 913. In an implementation, the first carbon precursor 912 may be conveyed by the carrier gas 916 and introduced into the reaction space 950. In an implementation, the second carbon precursor 913 may be conveyed by the carrier gas 916 and introduced into the reaction space 950.

As shown in FIG. 3, the at least two different first and second carbon precursors 912 and 913 may be supplied to the reaction space 950 via special supply lines. The first carbon precursor 912 may be supplied to the reaction space 950 via a first transfer line 912s. The second carbon precursor 913 may be supplied to the reaction space 950 via a second transfer line 913s. In an implementation, the first transfer line 912s and the second transfer line 913s may not be joined together before they reach the reaction space 950.

The first carbon precursor 912 and the second carbon precursor 913 may each independently include, e.g., an alkane having a carbon number of 1 to 10, an alkene having a carbon number of 2 to 10, an alkylamine having a carbon number of 1 to 15, a nitrogen-containing heterocyclic compound having a carbon number of 4 to 15, an alkylsilane having a carbon number of 1 to 20, an alkoxysilane having a carbon number of 1 to 20, and/or an alkylsiloxane having a carbon number of 1 to 20.

The alkane having a carbon number of 1 to 10 may include, e.g., methane, ethane, propane, butane (all isomers), pentane (all isomers), hexane (all isomers), heptane (all isomers), octane (all isomers), nonane (all isomers), decane (all isomers), or a mixture thereof.

The alkene having a carbon number of 2 to 10 may include, e.g., ethylene, propylene, butene (all isomers), hexene (all isomers), heptene (all isomers), octene (all isomers), nonene (all isomers), decene (all isomers), or a mixture thereof.

The alkylamine having a carbon number of 1 to 15 may have, e.g., the formula $NR^1R^2R^3$. In an implementation, $R^1$, $R^2$, and $R^3$ may each independently be, e.g., hydrogen, an halogen element, an alkyl having a carbon number of 1 to 10, an alkenyl having a carbon number of 1 to 10, an alkylamine having a carbon number of 1 to 10, an aryl having a carbon number of 6 to 12, an aryl alkyl having a carbon number of 7 to 12, an alkyl aryl having a carbon number of 7 to 12, and/or a cycloalkyl having a carbon number of 5 to 12. In an implementation, at least one of $R^1$, $R^2$, and $R^3$ may be, e.g., an alkyl having a carbon number of 1 to 10. In an implementation, two of $R^1$, $R^2$, and $R^3$ may be connected to each other to form a ring. In an implementation, two or more alkylamines may be connected to each other to form alkyldiamine, alkyltriamine, or the like, and alkyldiamine, alkyltriamine, or the like may belong to the alkylamine having a carbon number of 1 to 15.

Examples of the alkylamine having a carbon number of 1 to 15 may include monomethylamine, dimethyl amine, trimethyl amine, monoethylamine, diethylamine, triethylamine, mono-propyl amine (all isomers), dipropylamine (all isomers), tripropylamine (all isomers), mono-butyl amine (all isomers), dibutylamine (all isomers), tributylamine (all isomers), mono-pentyl amine (all isomers), dipentylamine (all isomers), tripentylamine (all isomers), mono-hexyl amine (all isomers), dihexylamine (all isomers), mono-heptyl amine (all isomers), diheptylamine (all isomers), mono-octyl amine (all isomers), mono-nonyl amine (all isomers), mono-decyl amine (all isomers), mono-undecyl amine (all isomers), mono-dodecyl amine (all isomers), mono-tridecyl amine (all isomers), mono-tetradecyl amine (all isomers), mono-pentadecyl amine (all isomers), dimethyl (ethyl) amine (all isomers), dimethyl (propyl) amine (all isomers), dimethyl (butyl) amine (all isomers), dimethyl (pentyl) amine (all isomers), dimethyl (hexyl) amine (all isomers), dimethyl (heptyl) amine (all isomers), dimethyl (octyl) amine (all isomers), dimethyl (nonyl) amine (all isomers), dimethyl (decyl) amine (all isomers), dimethyl (undecyl) amine (all isomers), dimethyl (dodecyl) amine (all isomers), dimethyl (tridecyl) amine (all isomers), diethyl (methyl) amine (all isomers), diethyl (propyl) amine (all isomers), diethyl (butyl) amine (all isomers), diethyl (pentyl) amine (all isomers), diethyl (hexyl) amine (all isomers), diethyl (heptyl) amine (all isomers), diethyl (octyl) amine (all isomers), diethyl (nonyl) amine (all isomers), diethyl (decyl) amine (all isomers), diethyl (undecyl) amine (all isomers), dipropyl (methyl) amine (all isomers), dipropyl (ethyl) amine (all isomers), dipropyl (butyl) amine (all isomers), dipropyl (pentyl) amine (all isomers), dipropyl (hexyl) amine (all isomers), dipropyl (heptyl) amine (all isomers), dipropyl (octyl) amine (all isomers), dipropyl (nonyl) amine (all isomers), dibutyl (methyl) amine (all isomers), dibutyl (ethyl) amine (all isomers), dibutyl (propyl) amine (all isomers), dibutyl (pentyl) amine (all isomers), dibutyl (hexyl) amine (all isomers), dibutyl (heptyl) amine (all isomers), dipentyl (methyl) amine (all isomers), dipentyl (ethyl) amine (all isomers), dipentyl (propyl) amine (all isomers), dipentyl (butyl) amine (all isomers), dihexyl (methyl) amine (all isomers), dihexyl (ethyl) amine (all isomers), dihexyl (propyl) amine (all isomers), diheptyl (methyl) amine (all isomers), dimethyl (butenyl) amine (all isomers), dimethyl (pentenyl) amine (all isomers), dimethyl (hexenyl) amine (all isomers), dimethyl (heptenyl) amine (all isomers), dimethyl (octenyl) amine (all isomers), dimethyl (cyclopentenyl) amine (all isomers), dimethyl (cyclohexyl) amine (all isomers), dimethyl (cycloheptyl) amine (all isomers), bis (methyl cyclopentyl) amine (all isomers), (dimethyl cyclopentyl) amine (all isomers), bis (dimethyl cyclopentyl) amine (all isomers), (ethyl cyclopentyl) amine (all isomers), bis (ethylcyclopentyl) amine (all isomers), (methylethyl cyclopentyl) amine (all isomers), bis (methylethyl cyclopentyl) amine (all isomers), N-methyl ethylene diamine (all isomers), N-ethyl ethylene diamine (all isomers), N-propyl ethylene diamine (all isomers), N-butyl ethylene diamine (all isomers), N-pentyl ethylene diamine (all isomers), N-hexyl ethylene diamine (all isomers), N-heptyl ethylene diamine (all isomers), N-octyl ethylene diamine (all isomers), N-nonyl ethylene diamine (all isomers), N-decyl 1 ethylene diamine (all isomers), N-undecyl ethylene diamine (all isomers), and N-dodecyl ethylene diamine (all isomers).

The nitrogen-containing heterocyclic compound having a carbon number of 4 to 15 may include, e.g., at least one compound of the following Formula 1 to Formula 8:

[Formula 1]

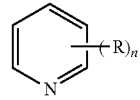

[Formula 2]

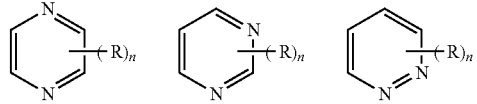

[Formula 3]

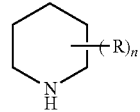

[Formula 4]

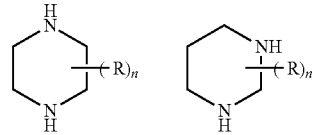

[Formula 5]

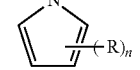

[Formula 6]

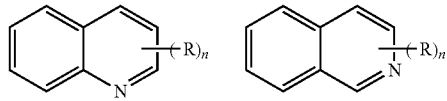

[Formula 7]

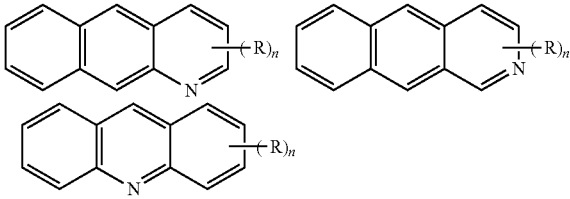

[Formula 8]

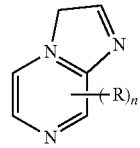

In Formulae 1 to 8, n may be an integer of 1 to 4 and R may be, e.g., hydrogen, an alkyl having a carbon number of 1 to 10, an alkenyl having a carbon number of 1 to 10, an aryl having a carbon number of 6 to 12, an aryl alkyl having a carbon number of 7 to 12, an alkyl aryl having a carbon number of 7 to 12, and/or a cycloalkyl having a carbon number of 5 to 12.

The alkylsilane having a carbon number of 1 to 20 may have, e.g., the formula $R^1$—$(SiR^2R^3)n$-$R^4$. In an implementation, n may be an integer of 1 to 12 and $R^1$, $R^2$, $R^3$, and $R^4$ may each independently be, e.g., hydrogen, an halogen element, an alkyl having a carbon number of 1 to 10, an alkenyl having a carbon number of 1 to 10, an alkylamino having a carbon number of 1 to 10, an aryl having a carbon number of 6 to 12, an aryl alkyl having a carbon number of 7 to 12, an alkyl aryl having a carbon number of 7 to 12, and/or a cycloalkyl having a carbon number of 5 to 12. In an implementation, at least one of $R^1$, $R^2$, $R^3$, and $R^4$ may include carbon atoms that are directly combined with Si. In an implementation, $R^1$ and $R^4$ may be connected to each other to form a ring.

Examples of the alkylsilane having a carbon number of 1 to 20 may include methylsilane, tetramethylsilane (TMS), tetraethylsilane (TES), tetrapropylsilane, tetrabutylsilane, dimethylsilane (DMS), diethylsilane (DES), dimethyldifluorosilane (DMDFS), dimethyldichlorosilane (DMDCS), diethyldichlorosilane (DEDCS), hexamethyldisilane, dodecamethylcyclohexasilane, dimethyldiphenylsilane, diethyldiphenylsilane, methyltrichlorosilane, methyltriphenylsilane, and dimethyldiethylsilane.

The alkoxysilane having a carbon number of 1 to 20 may be a compound in which substituted or unsubstituted alkoxy groups are combined with a silicon atom at the center, and may have, e.g., the formula $R^1$—$(SiR^2R^3)n$-$R^4$. In an implementation, n may be an integer of 1 to 12 and $R^1$, $R^2$, $R^3$, and $R^4$ may each independently be, e.g., hydrogen, an halogen element, an alkyl having a carbon number of 1 to 10, an alkoxy having a carbon number of 1 to 10, an alkenyl having a carbon number of 1 to 10, an alkylamino having a carbon number of 1 to 10, an aryl having a carbon number of 6 to 12, an aryl alkyl having a carbon number of 7 to 12, an alkyl aryl having a carbon number of 7 to 12, and/or a cycloalkyl having a carbon number of 5 to 12. In an implementation, at least one of $R^1$, $R^2$, $R^3$, and $R^4$ may be an alkoxy having a carbon number of 1 to 10, and/or at least one of $R^1$, $R^2$, $R^3$, and $R^4$ may include carbon atoms that are directly combined with Si. In an implementation, $R^1$ and $R^4$ may be connected to each other to form a ring.

Examples of the alkoxysilane having a carbon number of 1 to 20 may include trimethoxysilane (TMOS), dimethoxysilane (DMOS), methoxysilane (MOS), methyldimethoxysilane (MDMOS), diethoxymethylsilane (DMES), dimethylethoxysilane, dimethylaminomethoxysilane (DMAMES), dimethylmethoxysilane (DMMOS), methyltrimethoxysilane, dimethyldimethoxysilane, phenyltrimethoxysilane, diphenyldimethoxysilane, diphenyldiethoxysilane, triphenylmethoxysilane, and triphenylethoxysilane.

The alkylsiloxane having a carbon number of 1 to 20 may include two or more silicon atoms connected to each other with oxygen atoms interposed therebetween, and may have, e.g., the formula $R^1$—$([SiR^2R^3]$—$O)n$-$R^4$. In an implementation, n may be an integer of 2 to 12 and $R^1$, $R^2$, $R^3$, and $R^4$ may each independently be, e.g., hydrogen, a halogen element, an alkyl having a carbon number of 1 to 10, an alkoxy having a carbon number of 1 to 10, an alkenyl having a carbon number of 1 to 10, an alkylamino having a carbon number of 1 to 10, an aryl having a carbon number of 6 to 12, an aryl alkyl having a carbon number of 7 to 12, an alkyl aryl having a carbon number of 7 to 12, and/or a cycloalkyl having a carbon number of 5 to 12. In an implementation, at least one of $R^1$, $R^2$, $R^3$, and $R^4$ may include carbon atoms that are directly combined with Si. In an implementation, $R^1$ and $R^4$ may be connected to each other to form a ring.

Examples of the alkylsiloxane having a carbon number of 1 to 20 may include hexamethylcyclotrisiloxane, tetramethylcyclotetrasiloxane, tetraethylcyclotetrasiloxane, octamethylcyclotetrasiloxane, and hexamethyldisiloxane.

In an implementation, at least one of the alkylsilane having a carbon number of 1 to 20, alkoxysilane having a carbon number of 1 to 20, and alkylsiloxane having a carbon number of 1 to 20 described above may have a molecular weight of about 50 to about 1,000. In an implementation, at least one of the alkylsilane having a carbon number of 1 to 20, alkoxysilane having a carbon number of 1 to 20, and alkylsiloxane having a carbon number of 1 to 20 may have a molecular weight of about 100 to about 400.

In an implementation, the silicon precursor may include, e.g., silane ($SiH_4$), disilane ($Si_2H_6$), monochlorosilane ($SiClH_3$), dichlorosilane ($SiCl_2H_2$), trichlorosilane ($SiCl_3H$), hexachlorodisilane ($Si_2Cl_6$), diethyl silane ($Et_2SiH_2$), tetraethyl orthosilicate ($Si(OCH_2CH_3)_4$, TEOS), or alkyl amino silane-based compounds. The alkyl amino silane-based compound may include, e.g., diisopropylan amino silane ($H_3Si(N(i$-$Prop)_2)$), bis (tertiary-butylan amino) silane (($C_4H_9(H)N)_2SiH_2$), tetrakise (dimethylan amino) silane ($Si(NMe_2)_4$), tetrakise (ethylmethylan amino) silane ($Si(NEtMe)_4$), tetrakise (diethylan amino) silane ($Si(NEt_2)_4$), tris (dimethylan amino) silane ($HSi(NMe_2)_3$), tris (ethylmethylan amino) silane ($HSi(NEtMe)_3$), tris (diethylan amino) silane ($HSi(NEt_2)_3$), tris (dimethyl hydrazino) silane ($HSi(N(H)NMe_2)_3$), bis (diethylan amino) silane ($H_2Si(NEt_2)_2$), bis(diisopropylan amino) silane ($H_2Si(N(i$-$Prop)_2)_2$), tris (isopropylan amino) silane ($HSi(N(i$-$Prop)_2)_3$), or (diisopropylan amino) silane ($H_3Si(N(i$-$Prop)_2)$).

Herein, Me represents a methyl group, Et represents an ethyl group, i-Prop represents an iso-propyl group, n-Prop represents an n-propyl group, Bu represents a butyl group, n-Bu represents an n-butyl group, Cp represents a cyclopentadienyl group, THD represents 2,2,6,6-tetramethyl-3,5-heptanedionate, TMPD represents 2,2,6,6-tetramethyl-p-phenylenediamine, acac represents acetylacetonate, hfac represents hexafluoro acetylacetonate, and FOD represents 6,6,7,7,8,8,8-heptafluoro-2,2-dimethyl-3,5-octane dionate.

In an implementation, the oxygen reactant may include, e.g., $O_3$, $H_2O$, $O_2$, $NO_2$, NO, $N_2O$, $H_2O$, alcohol, metal alkoxide, plasma $O_2$, remote plasma $O_2$, plasma $N_2O$, plasma $H_2O$, or a combination thereof. In an implementation, the nitrogen reactant may include, e.g., $N_2$, $NH_3$, hydrazine ($N_2H_4$), plasma $N_2$, remote plasma $N_2$, or a combination thereof.

A sequence in which the above-described process gases are supplied into the reaction space 950 will now be described.

Figure 4A:
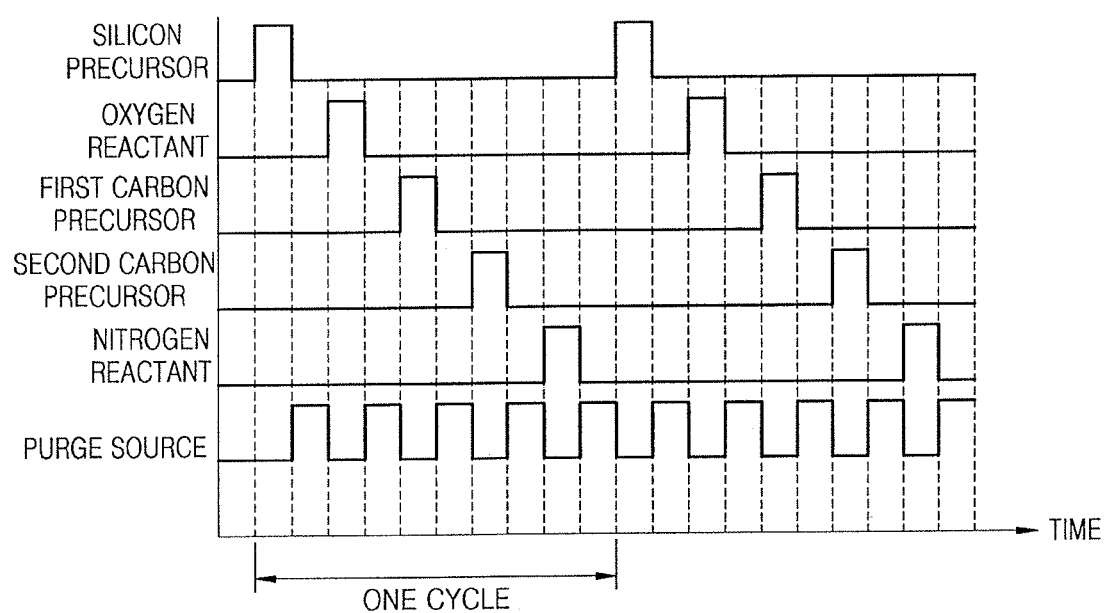
FIGS. 4A to 4E illustrate timing diagrams of a supply sequence of process gases according to an embodiment.

FIG. 4A illustrates a timing diagram of a supply sequence of process gases according to an embodiment.

Referring to FIG. 4A, process gases may be sequentially supplied into the reaction space 950 in the order of, e.g., a silicon precursor, an oxygen reactant, a first carbon precursor, a second carbon precursor, and a nitrogen precursor. Supply timings of these process gases may be separated from one another by supply timings of a purge gas.

In an implementation, the process gases may be sequentially supplied into the reaction space 950 in the order of a silicon precursor, an oxygen reactant, a first carbon precursor, a second carbon precursor, and a nitrogen precursor as illustrated in FIG. 4A. In an implementation, the supply order may appropriately vary depending on, e.g., reaction activity between a precursor and each reactant.

In an implementation, pulse supplies of the silicon precursor, the oxygen reactant, the first carbon precursor, the second carbon precursor, and the nitrogen precursor may form a single cycle. The cycle may repeat until the SiOCN material layer is formed to have a desired thickness.

In an implementation, at least one of the first carbon precursor and the second carbon precursor may be, e.g., (i) alkylamine having a carbon number of 1 to 15 and/or a nitrogen-containing heterocyclic compound having a carbon number of 4 to 15; or (ii) alkylsilane having a carbon number of 1 to 20, alkoxysilane having a carbon number of 1 to 20, and/or alkylsiloxane having a carbon number of 1 to 20.

In an implementation, the first carbon precursor may be alkylamine having a carbon number of 1 to 15 and/or a nitrogen-containing heterocyclic compound having a carbon number of 4 to 15, and the second carbon precursor may be one of the previously-described compounds, e.g., an alkane having a carbon number of 1 to 10 and/or alkene having a carbon number of 2 to 10.

In an implementation, the first carbon precursor may be alkylsilane having a carbon number of 1 to 20, alkoxysilane having a carbon number of 1 to 20, and/or alkylsiloxane having a carbon number of 1 to 20, and the second carbon precursor may be one of the previously-described compounds, e.g., an alkane having a carbon number of 1 to 10 and/or alkene having a carbon number of 2 to 10.

In an implementation, the first carbon precursor may be one of the previously-described compounds, e.g., an alkane having a carbon number of 1 to 10 and/or alkene having a carbon number of 2 to 10, and the second carbon precursor may be alkylamine having a carbon number of 1 to 15 and/or a nitrogen-containing heterocyclic compound having a carbon number of 4 to 15.

In an implementation, the first carbon precursor may be one of the previously-described compounds, e.g., alkane having a carbon number of 1 to 10 and/or alkene having a carbon number of 2 to 10, and the second carbon precursor may be alkylsilane having a carbon number of 1 to 20, alkoxysilane having a carbon number of 1 to 20, and/or alkylsiloxane having a carbon number of 1 to 20.

When the first carbon precursor and the second carbon precursor are composed as described above, a high oxygen content and a high carbon content may be secured even at a relatively low process temperature, e.g., of 600° C. or less. The high carbon content may result in an improvement of tolerance to etching. The high oxygen content may result in a reduction in a dielectric constant. For example, the dielectric constant may be reduced to be less than 5.0 via material selection as described above.

Figure 4B:
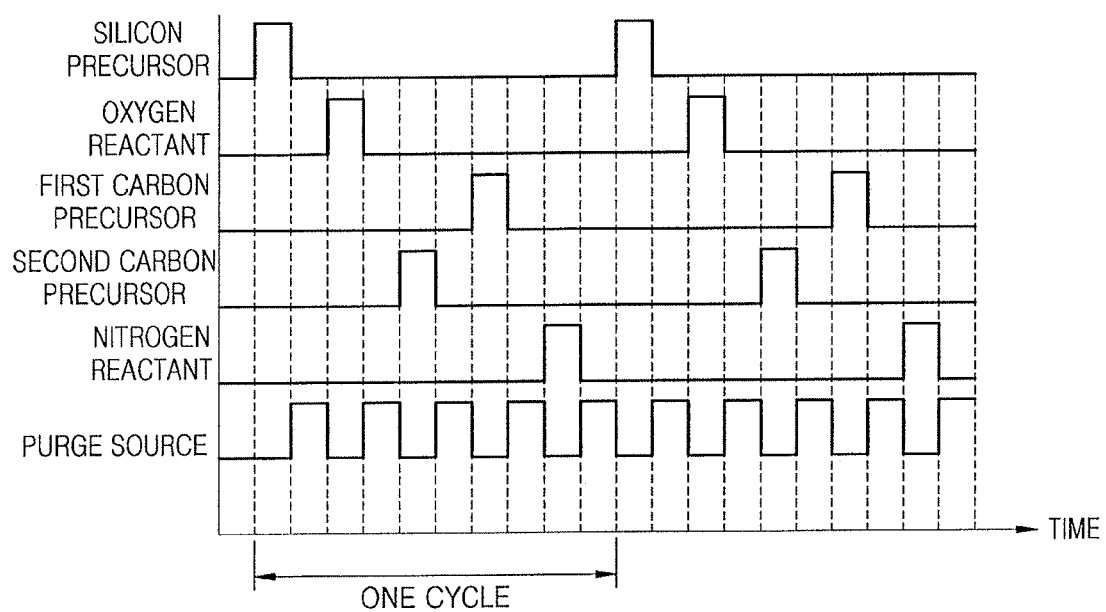

FIG. 4B illustrates a timing diagram of a supply sequence of process gases according to another embodiment.

The embodiment of FIG. 4B is different from that of FIG. 4A in that the first carbon precursor may be supplied after the second carbon precursor is supplied. The first carbon precursor and the second carbon precursor may be different in terms of affinity with a surface, chemisorption characteristics, and reactivity with another reactant, and the properties of a subsequently obtained material layer may vary with an change in the supply sequence.

Figure 4C:
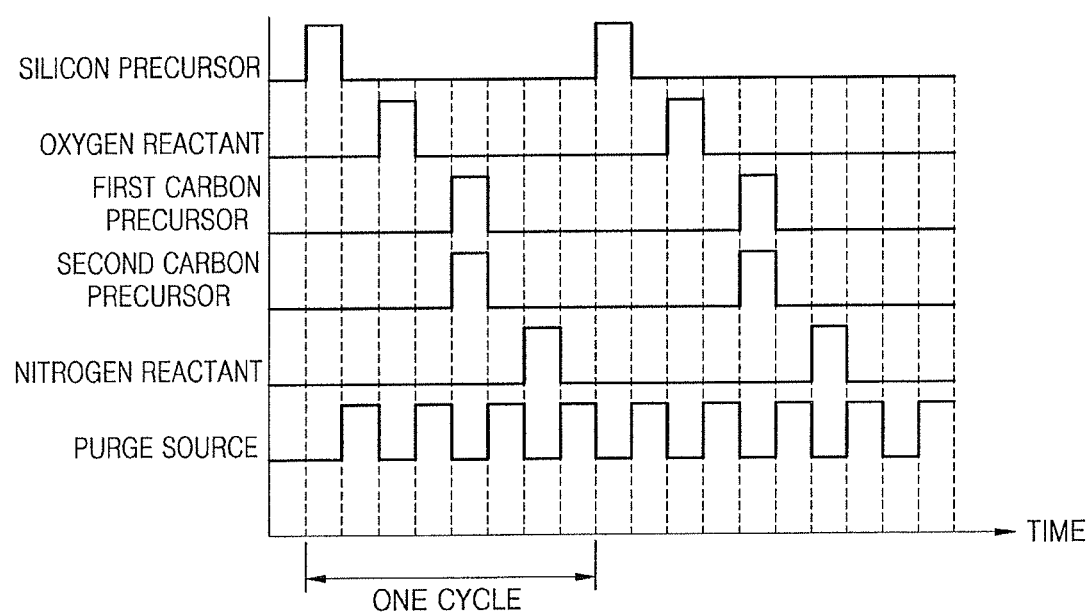
Figure 4D:
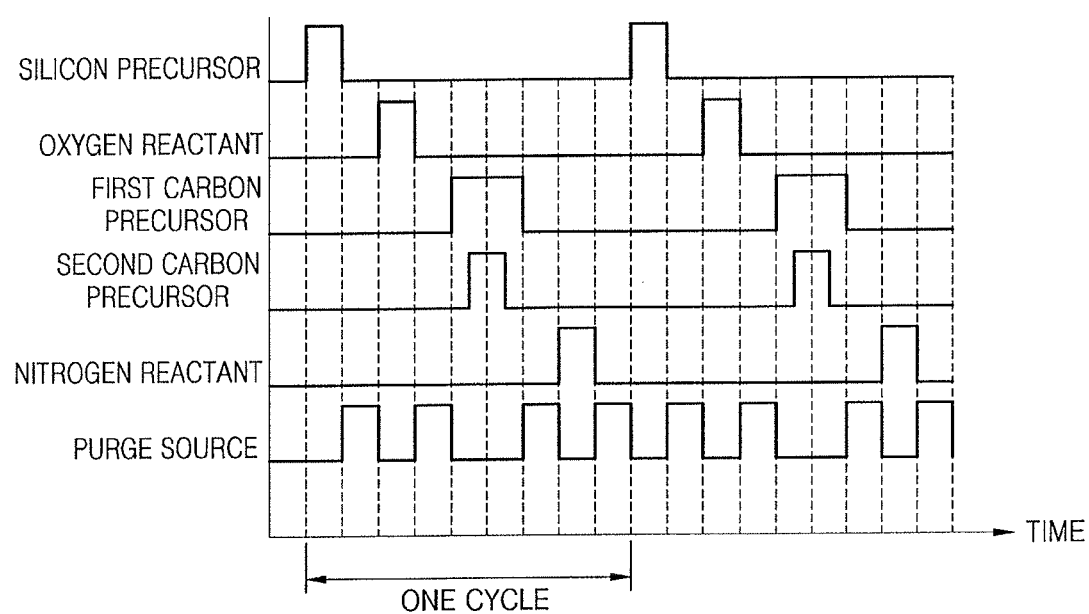
Figure 4E:
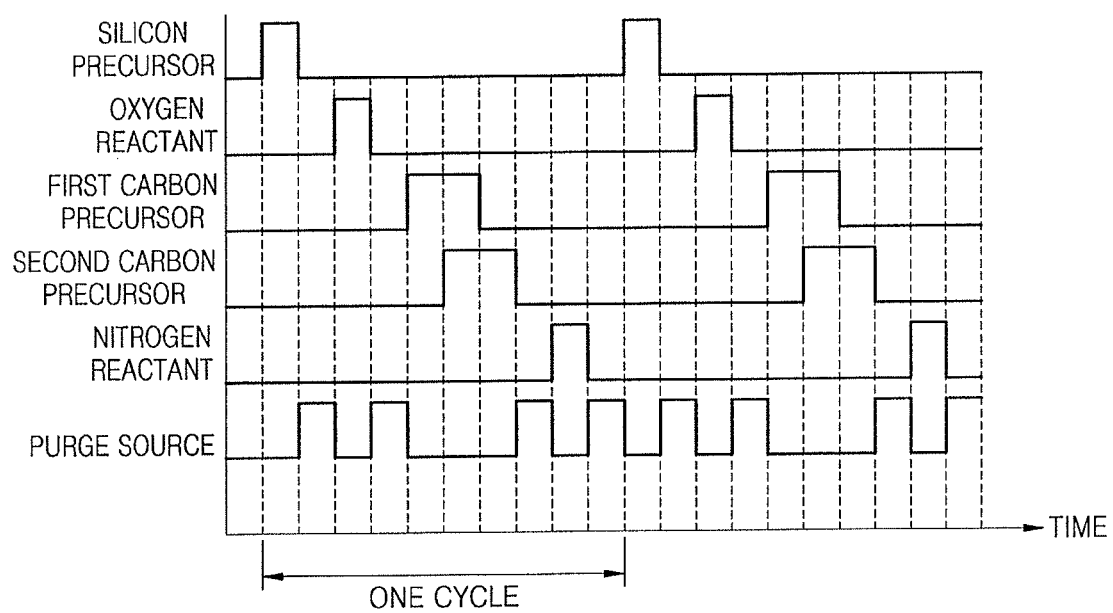

FIGS. 4C to 4E illustrate timing diagrams showing a supply sequence of process gases according to other embodiments.

The embodiment of FIG. 4C is different from those of FIGS. 4A and 4B in that the first carbon precursor and the second carbon precursor may be supplied at the same time.

For example, when the first carbon precursor and the second carbon precursor have similar chemisorption characteristics, this supply method may be used.

The embodiment of FIG. 4D is different from those of FIGS. 4A to 4C in that, the supply times of the first carbon precursor and the second carbon precursor overlap with each other, but supplying the first carbon precursor starts before the second carbon precursor is supplied and ends after the supply of the second carbon precursor is stopped. For example, when the second carbon precursor is supplied to adjust the content of a specific component of a subsequently obtained material layer, this supplying method may be used.

In an implementation, a supplying method performed in reverse compared to the above-described supplying method may be used in consideration of affinity with a surface, chemisorption characteristics, and reactivity with another reactant of each of the first carbon precursor and the second carbon precursor. For example, supply of the second carbon precursor may start before the first carbon precursor is supplied and end after the supply of the first carbon precursor is stopped.

Referring to FIG. 4E, supply of the first carbon precursor may temporally and/or partially overlap with supply of the second carbon precursor. As shown in FIG. 4E, supply of the first carbon precursor may start before supply of the second carbon precursor starts, supply of the second carbon precursor may start before supply of the first carbon precursor ends, and supply of the second carbon precursor may end after supply of the first carbon precursor ends. This supplying method may be used to correct, e.g., a difference between respective chemisorption characteristics of the first carbon precursor and the second carbon precursor.

In an implementation, a supplying method reverse to the above-described supplying method may be used in consideration of affinity with a surface, chemisorption characteristics, and reactivity with another reactant of each of the first carbon precursor and the second carbon precursor. For example, supply of the second carbon precursor may start before supply of the first carbon precursor starts, supply of the first carbon precursor may start before supply of the second carbon precursor ends, and supply of the first carbon precursor may end after supply of the second carbon precursor ends.

In an implementation, when alkylamine having a carbon number of 1 to 15 or a nitrogen-containing heterocyclic compound having a carbon number of 4 to 15 is used as the second carbon precursor, nitrogen atoms may be included in the second carbon precursor, and supply of a nitrogen reactant may be omitted. For example, the second carbon precursor and the nitrogen reactant may be the same materials, and thus may be supplied in an identical or in a single operation.

Figure 5:
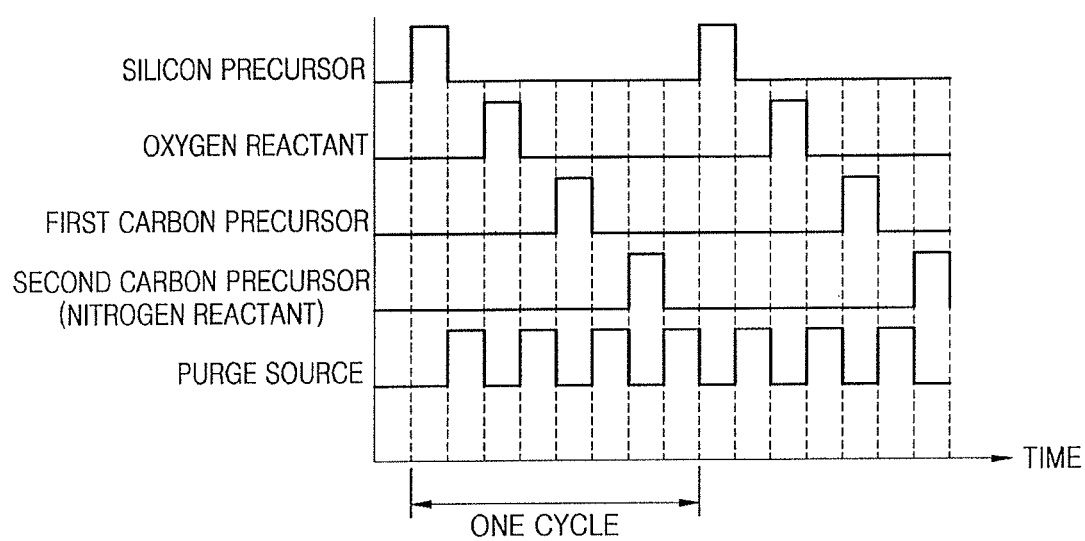
FIG. 5 illustrates a timing diagram showing a supply sequence of process gases when a second carbon precursor and a nitrogen reactant are the same.

FIG. 5 illustrates a timing diagram showing a supply sequence of process gases when the second carbon precursor and the nitrogen reactant are one in the same.

Referring to FIG. 5, the process gases may be sequentially supplied into the reaction space 950 in the order of a silicon precursor, an oxygen reactant, a first carbon precursor, and a second carbon precursor (i.e., the same as a nitrogen reactant). Supply pulses of these process gases may be separated from one another by supply pulses of a purge gas.

In an implementation, the process gases may be sequentially supplied into the reaction space 950 in the order of a silicon precursor, an oxygen reactant, a first carbon precursor, and a second carbon precursor (i.e., a nitrogen reactant) as illustrated in FIG. 5. In an implementation, the supply order may appropriately vary depending on, e.g., reaction activity between a precursor and each reactant.

In an implementation, pulse supplies of the silicon precursor, the oxygen reactant, the first carbon precursor, and the second carbon precursor (i.e., a nitrogen reactant) may form a single cycle. The cycle may be repeated until the SiOCN material layer is formed to have a desired thickness.

In the embodiment of FIG. 5, the first carbon precursor and the second carbon precursor may be sequentially supplied, and supply pulses of the first and second carbon precursors may be separated from each other by the supply pulses of the purge gas. In an implementation, according to the characteristics of precursors and reactants, methods of supplying the first carbon precursor and the second carbon precursor as described above with reference FIGS. 4B-4E may be employed in the embodiment of FIG. 5.

In an implementation, when at least one of alkylsilane having a carbon number of 1 to 20, alkoxysilane having a carbon number of 1 to 20, and alkylsiloxane having a carbon number of 1 to 20 is used as the first carbon precursor, silicon atoms may be included in the first carbon precursor, and supply of a silicon precursor may be omitted. For example, the silicon precursor and the first carbon precursor may be the same materials and thus may be supplied in an identical or a single operation.

Figure 6:
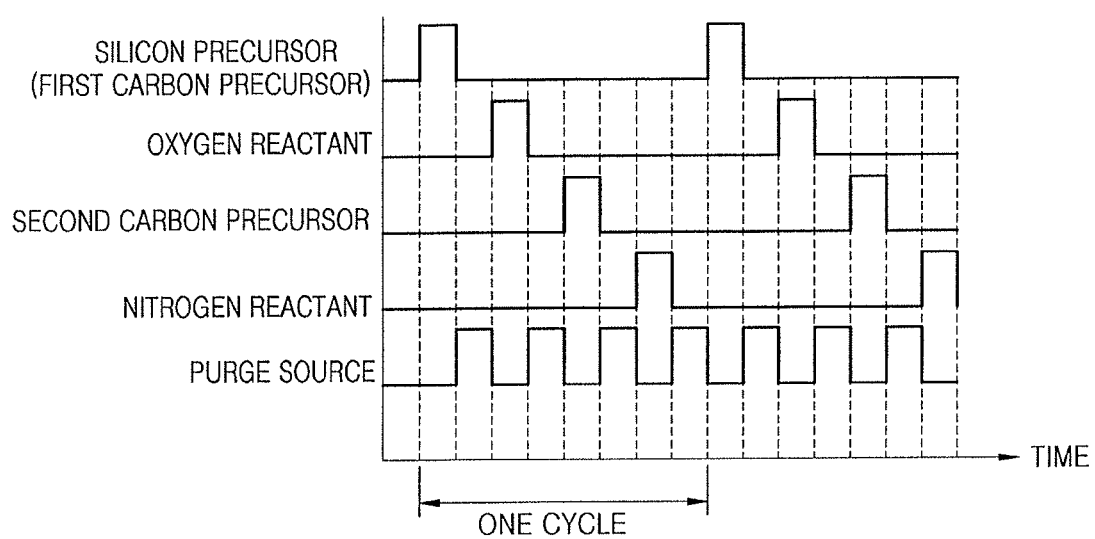
FIG. 6 illustrates a timing diagram showing a supply sequence of process gases when a silicon precursor and a first carbon precursor are the same.

FIG. 6 illustrates a timing diagram showing a supply sequence of process gases when the silicon precursor and the first carbon precursor are one in the same.

Referring to FIG. 6, process gases may be sequentially supplied into the reaction space 950 in the order of a silicon precursor (i.e., the same as a first carbon precursor), an oxygen reactant, a second carbon precursor, and a nitrogen reactant. Supply pulses of these process gases may be separated from one another by supply pulses of a purge gas.

In an implementation, the process gases may be sequentially supplied into the reaction space 950 in the order of a silicon precursor (i.e., a first carbon precursor), an oxygen reactant, a second carbon precursor, and a nitrogen reactant as illustrated in FIG. 6. In an implementation, the supply order may appropriately vary depending on, e.g., reaction activity between a precursor and each reactant.

In an implementation, pulse supplies of the silicon precursor (i.e., a first carbon precursor), the oxygen reactant, the second carbon precursor, and the nitrogen reactant may form a single cycle. The cycle may be repeated until the SiOCN material layer is formed to have a desired thickness.

In the embodiment of FIG. 6, the silicon precursor (i.e., the first carbon precursor) and the second carbon precursor may be sequentially supplied, and supply pulses of the silicon precursor and the second carbon precursor may be separated from each other by the supply pulses of the purge gas. In an implementation, according to the characteristics of precursors and reactants, methods of supplying the silicon precursor (i.e., the first carbon precursor) and the second carbon precursor as described above with reference FIGS. 4B-4E may be employed in the embodiment of FIG. 6.

In an implementation, at least one of an alkylsilane having a carbon number of 1 to 20, an alkoxysilane having a carbon number of 1 to 20, or an alkylsiloxane having a carbon number of 1 to 20 may be used as the first carbon precursor, and an alkylamine having a carbon number of 1 to 15 or a nitrogen-containing heterocyclic compound having a carbon number of 4 to 15 may be used as the second carbon precursor. In this case, supply of the silicon precursor may be omitted because silicon atoms may be included in and provided from the first carbon precursor, and supply of the nitrogen reactant may be omitted because nitrogen atoms may be included in and provided from the second carbon precursor. For example, the silicon precursor and the first carbon precursor may be the same materials and thus may be supplied in an identical or a single operation. The second carbon precursor and the nitrogen reactant may be the same materials and thus may be supplied in an identical or single operation.

Figure 7:
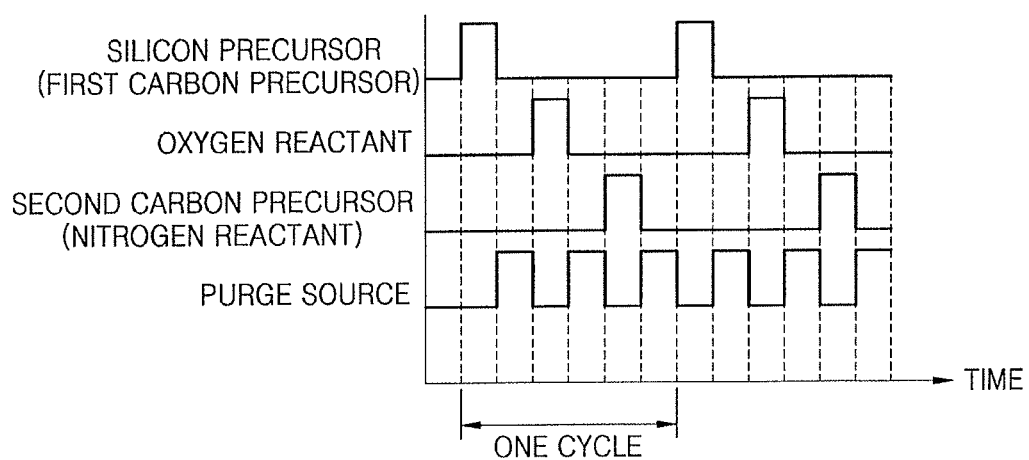
FIG. 7 illustrates a timing diagram showing a supply sequence of process gases when a silicon precursor and a first carbon precursor are the same and a second carbon precursor and a nitrogen reactant are the same.

FIG. 7 illustrates a timing diagram showing a supply sequence of process gases when the silicon precursor and the first carbon precursor are one in the same and the second carbon precursor and the nitrogen reactant are one in the same.

Referring to FIG. 7, process gases may be sequentially supplied into the reaction space 950 in the order of a silicon precursor (i.e., also a first carbon precursor), an oxygen reactant, and a second carbon precursor (i.e., also a nitrogen reactant). Supply pulses of these process gases may be separated from one another by supply pulses of a purge gas.

In an implementation, the process gases may be sequentially supplied into the reaction space 950 in the order of a silicon precursor (i.e., a first carbon precursor), an oxygen reactant, and a second carbon precursor (i.e., a nitrogen reactant) as illustrated in FIG. 7. In an implementation, the supply order may appropriately vary depending on, e.g., reaction activity between a precursor and each reactant.

In an implementation, pulse supplies of the silicon precursor (i.e., the first carbon precursor), the oxygen reactant, and the second carbon precursor (i.e., the nitrogen reactant) may form a single cycle. The cycle may be repeated until the SiOCN material layer is formed to have a desired thickness.

In the embodiment of FIG. 7, the silicon precursor (also the first carbon precursor) and the second carbon precursor (also the nitrogen reactant) may be sequentially supplied, and supply pulses of the silicon precursor and the second carbon precursor may be separated from each other by the supply pulses of the purge gas. In an implementation, according to the characteristics of precursors and reactants, methods of supplying the silicon precursor (i.e., the first carbon precursor) and the second carbon precursor (i.e., the nitrogen reactant) as described above with reference FIGS. 4B-4E may be employed in the embodiment of FIG. 7.

By using at least one of alkylsilane having a carbon number of 1 to 20, alkoxysilane having a carbon number of 1 to 20, or alkylsiloxane having a carbon number of 1 to 20 as the first carbon precursor, and using alkylamine having a carbon number of 1 to 15 or a nitrogen-containing heterocyclic compound having a carbon number of 4 to 15 as the second carbon precursor, a high oxygen content and a high carbon content may be secured even at a significantly low temperature of, e.g., 500° C. or less. The high carbon content may result in an improvement of tolerance to etching. The high oxygen content may result in a reduction in a dielectric constant. For example, a dielectric constant of a layer formed may be reduced to be less than 4.4 via material selection as described above.

A semiconductor device including the material layer stack will now be described.

Figure 8A:
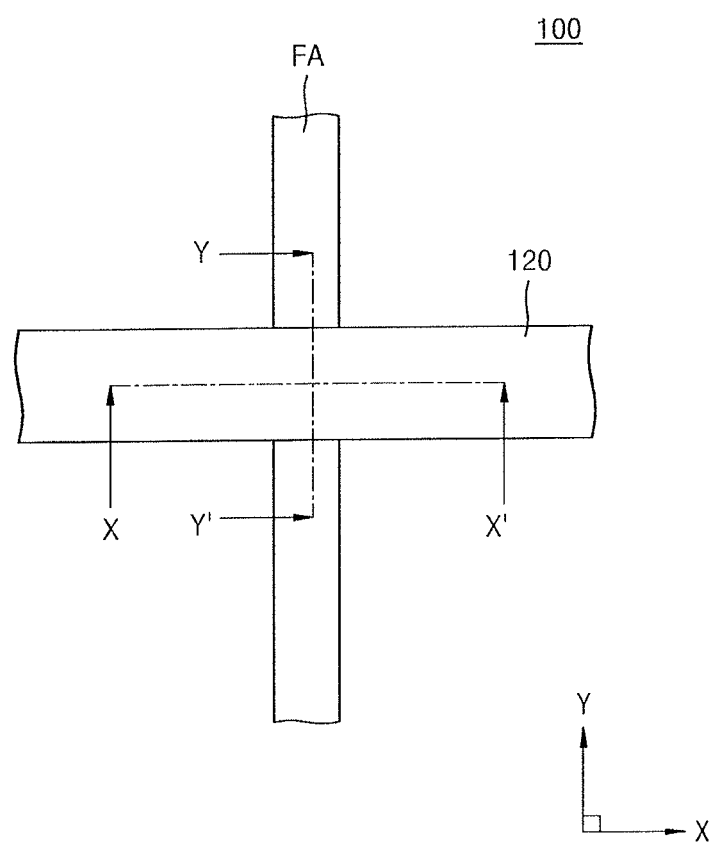
FIGS. 8A to 8D illustrate a semiconductor device having a SiOCN material layer on a semiconductor substrate. For example.
Figure 8B:
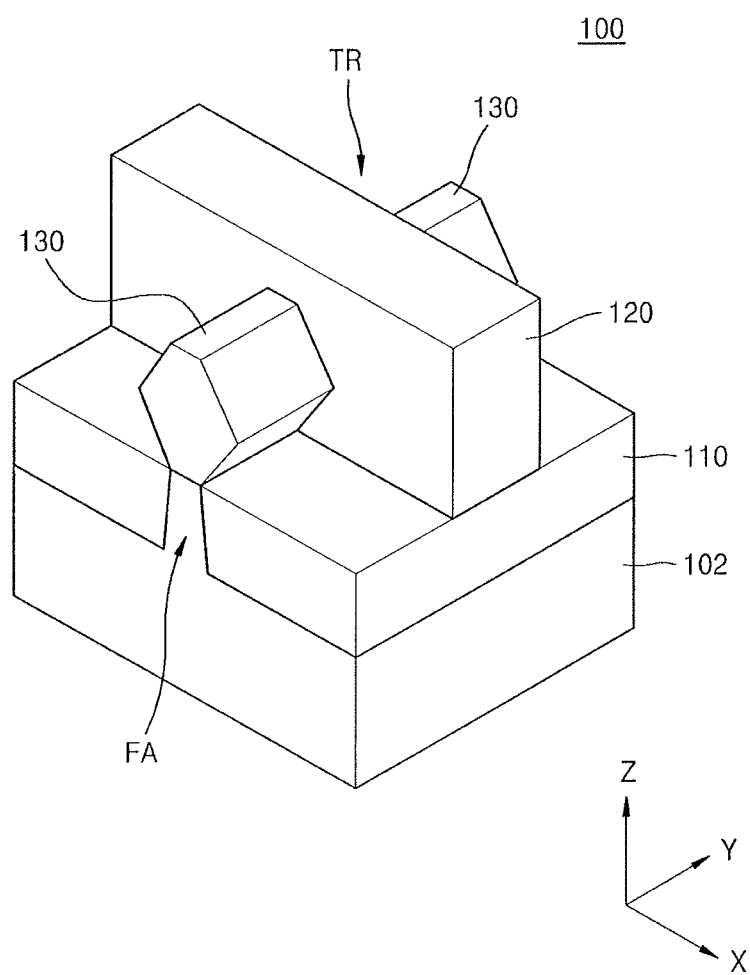
Figure 8C:
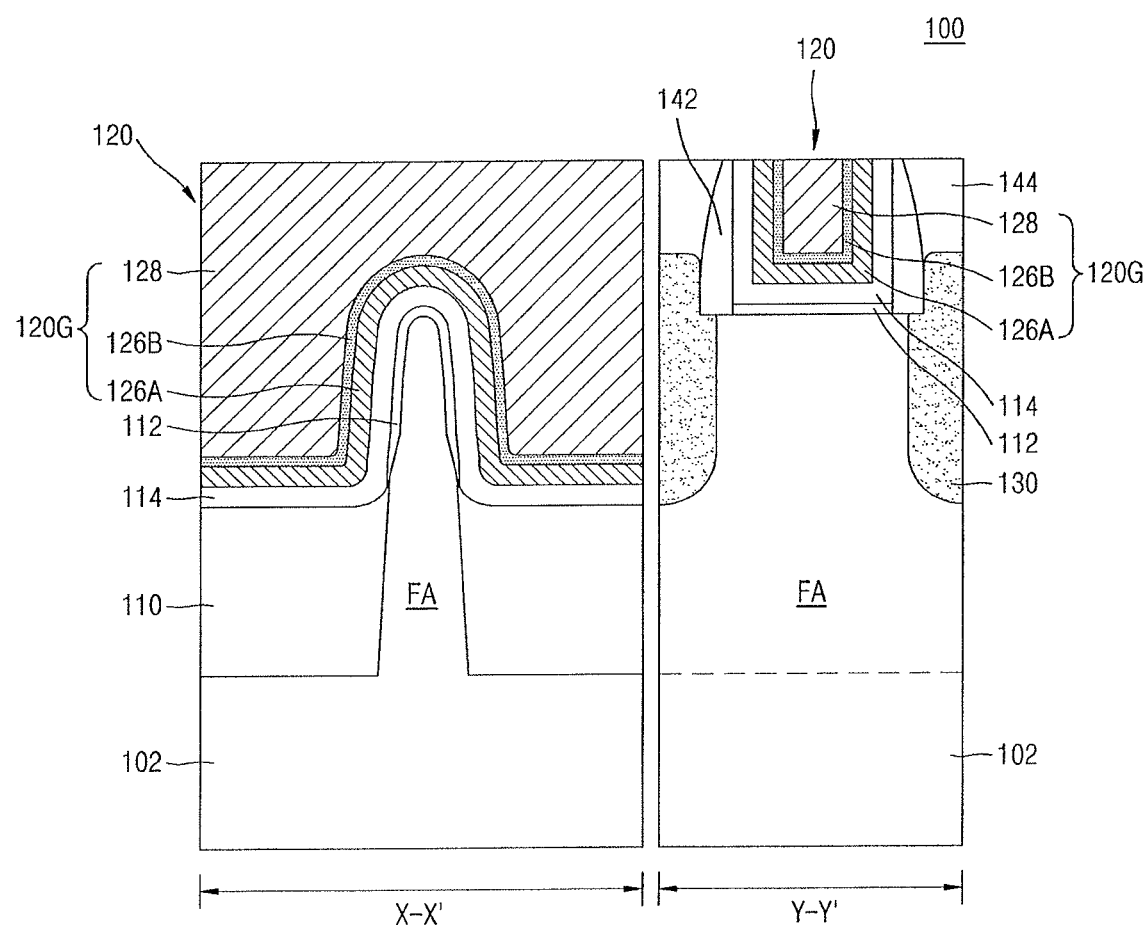
Figure 8D:
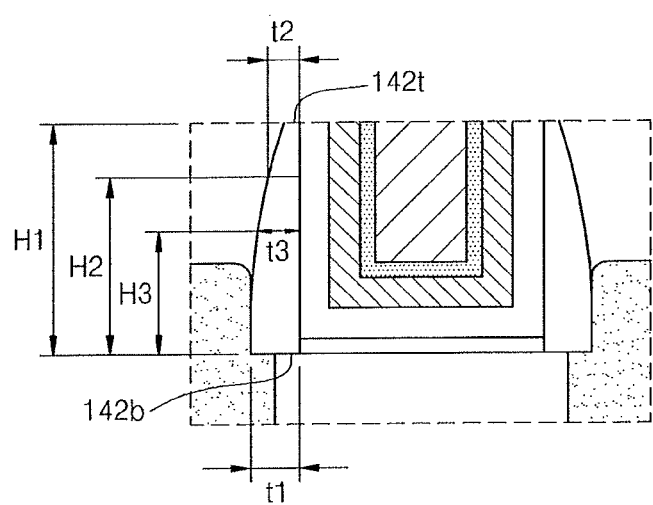

FIGS. 8A to 8D illustrate a semiconductor device 100 having a SiOCN material layer on a semiconductor substrate. FIG. 8A illustrates a plan view of the semiconductor device 100, FIG. 8B illustrates a perspective view of the semiconductor device 100, FIG. 8C illustrates a lateral cross-sectional view of the semiconductor device 100, and FIG. 8D illustrates a magnified cross-sectional view of a gate structure 120 of the semiconductor device 100 and a structure adjacent to the gate structure 120.

Referring to FIGS. 8A to 8D, the semiconductor device 100 may include a fin-type active area FA protruding from a substrate 102.

The substrate 102 may include a semiconductor such as Si or Ge, or a compound semiconductor such as SiGe, SiC, GaAs, InAs, or InP. In an implementation, the substrate 102 may be formed of at least one of a Group III and V element-containing material and a Group IV element-containing material. The Group III and V element-containing material may be a binary, ternary, or quaternary compound including at least one Group III element and at least one Group V element. The Group III and V element-containing material may be a compound including, as a Group III element, at least one of In, Ga, and Al and, as a Group V element, at least one of As, P, and Sb. For example, the Group III and V elements-containing material may be selected from InP, $In_zGa_{1-z}As$ (0≤z≤1), and $Al_zGa_{1-z}As$ (0≤z≤1). The binary compound may be one of InP, GaAs, InAs, InSb and GaSb, for example. The ternary compound may be one of InGaP, InGaAs, AlInAs, InGaSb, GaAsSb, and GaAsP. The Group IV element-containing material may be Si or Ge. In an implementation, a suitable Group III and V element-containing material and a suitable Group IV element-containing material that are usable by an IC device may be used. In an implementation, the substrate 102 may have a silicon-on-insulator (SOI) structure. The substrate 102 may include a conductive region, for example, an impurity-doped well or an impurity-doped structure.

The substrate 102 may be formed of the Group III and V element-containing material or the Group IV element-containing material, and the substrate 102 may be used as a channel material capable of forming a low-power and high-speed transistor. When an NMOS transistor is formed on the substrate 102, the substrate 102 may be formed of one of the above-exemplified Group III and V elements-containing materials. For example, the substrate 102 may be formed of GaAs. When a PMOS transistor is formed on the substrate 102, the substrate 102 may be formed of a semiconductor material having a higher mobility of holes, for example, Ge, compared with a Si substrate.

The fin-type active area FA may extend in one direction (Y direction in FIGS. 8A and 8B). An isolation layer 110 covering a lower sidewall of the fin-type active area FA is formed on the substrate 102. The fin-type active area FA protrudes in a fin shape on the isolation layer 110. In an implementation, the isolation layer 110 may be formed of a silicon oxide layer, a silicon nitride layer, a silicon oxynitride layer, or a combination thereof.

On the fin-type active area FA on the substrate 110, the gate structure 120 may extend in a direction (X direction) that intersects an extending direction of the fin-type active area FA. A pair of source/drain regions 130 may be formed on portions of the fin-type active area FA that are on both, e.g., opposite, sides of the gate structure 120.

The source/drain areas 130 may include a semiconductor layer epitaxially grown from the fin-type active area FA. Each of the source/drain regions 130 may be formed of an embedded SiGe structure including a plurality of epitaxially grown SiGe layers, an epitaxially grown Si layer, or an epitaxially grown SiC layer. In an implementation, the source/drain areas 130 may have a specific shape as illustrated in FIG. 8B. In an implementation, the source/drain areas 130 may have various shapes. For example, the source/drain areas 130 may have any of various cross-sectional shapes such as a circle, an oval, and a polygon.

A MOS transistor TR may be formed at an intersection between the fin-type active area FA and the gate structure 120. The MOS transistor TR is a three-dimensional (3D) MOS transistor in which a channel is formed on an upper surface and both lateral surfaces of the fin-type active area FA. The MOS transistor TR may constitute an NMOS transistor or a PMOS transistor.

As shown in FIG. 8C, the gate structure 120 may include an interface layer 112, a high-dielectric constant layer 114, a first metal-containing layer 126A, a second metal-containing layer 126B, and a gap-fill metal layer 128 sequentially formed on a surface of the fin-type active area FA. The first metal-containing layer 126A, the second metal-containing layer 126B, and the gap-fill metal layer 128 of the gate structure 120 may constitute a gate electrode 120G.

Insulation spacers 142 may be formed on sidewalls, e.g., both sidewalls, of the gate structure 120. The insulation spacers 142 may be or may include, e.g., SiOCN material layers. In an implementation, each of the insulation spacers 142 may be formed as a single layer. In an implementation, each of the insulation spacers 142 may be formed as a multi-layer in which at least two material layers are stacked.

In an implementation, the SiOCN material layer of the insulation spacer 142 may have a dielectric constant that is greater than or equal to 1 and less than 5.0. In an implementation, the SiOCN material layer of the insulation spacer 142 may have a dielectric constant that is greater than 1 or equal to and less than 4.8. In an implementation, the SiOCN material layer of the insulation spacer 142 may have a dielectric constant that is greater than or equal to 1 and less than 4.4.

When the SiOCN material layer includes carbon in an amount of, e.g., about 10 atom % to about 30 atom % and oxygen in an amount of, e.g., about 25 atom % to about 50 atom %, a desirably low dielectric constant may be achieved. In an implementation, the carbon content may be about 11 atom % to about 20 atom %. In an implementation, the oxygen content may be about 30 atom % to about 48 atom %. In an implementation, the carbon content may be about 15 atom % to about 20 atom %. In an implementation, the oxygen content may be about 38 atom % to about 48 atom %.

As shown in FIG. 8D, the insulation spacer 142 may have a height H1 and may include an upper end 142t and a lower end 142b. The upper end 142t may be a portion of the insulation spacer 142 that is farthest from (e.g., distal to) the fin-type active area FA. The lower end 142b may be a portion of the insulation spacer 142 that is closest to (e.g., adjacent to or contacting) the fin-type active area FA.

The insulation spacer 142 may have such a shape that a thickness thereof (e.g., in a lateral direction) decreases along a direction from the lower end 142b to the upper end 142t. For example, a thickness of the insulation spacer 142 may be reduced as a height thereof, e.g., a distance from the fin-type active area FA, increases. In an implementation, the lower end 142b of the insulation spacer 142 may have a plane that is at least partially flat. In an implementation, the lower end 142b of the insulation spacer 142 may be located on the same plane as a lower surface of the interface layer 112.

In an implementation, the upper end 142t of the insulation spacer 142 may have a plane or part that is at least partially flat. In an implementation, the upper end 142t of the insulation spacer 142 may be located on the same plane as an upper surface of the gate electrode 120G.

When the insulation spacer 142 includes a SiOCN material layer as described above, the insulation spacer 142 may have a relatively strong etching resistance, and a thickness of an upper portion of the insulation spacer 142 (e.g., in the lateral direction) may be greater than that of a spacer formed of other types of material layers. For example, less of the insulation spacer 142 may be removed during an etching process for forming a device, and as a result, thicknesses of the insulation spacer 142 may be greater. As shown in FIG. 8D, when the insulation spacer 142 has the height H1 as an overall height, the lower end 142b may have a thickness t1. At a height H2 (corresponding to 75% of the overall height of the insulation spacer 142 from the lower end 142b), the insulation spacer 142 may have a thickness t2 that may be equal to or greater than 0.4 times the thickness t1 (e.g., and less than or equal to the thickness t1). At a height H3 corresponding to 50% of the overall height of the insulation spacer 142 from the lower end 142b, the insulation spacer 142 may have a thickness t3 that may be equal to or greater than 0.8 times the thickness t1 (e.g., and less than or equal to the thickness t1).

In an implementation, at the height H2 corresponding to 75% of the overall height of the insulation spacer 142 from the lower end 142b, the insulation spacer 142 may have a thickness t2 that may be equal to or greater than 0.5 times the thickness t1 (e.g., and less than or equal to the thickness t1). At the height H3 corresponding to 50% of the overall height of the insulation spacer 142 from the lower end 142b, the insulation spacer 142 may have a thickness t3 that may be equal to or greater than 0.9 times the thickness t1 (e.g., and less than or equal to the thickness t1).

In an implementation, an interlayer insulation layer 144 may be formed on the insulation spacers 142.

The interface layer 112 may be formed on a surface of the fin-type active area FA. The interface layer 112 may be formed of an insulation material, such as, an oxide layer, a nitride layer, or an oxynitride layer. The interface layer 112 may constitute a gate insulation layer, together with the high-dielectric constant layer 114.

The high dielectric layer 114 may be formed of a material having a higher dielectric constant than a silicon oxide layer. For example, the high-dielectric constant layer 114 may have a dielectric constant of about 10 to about 25. The high dielectric layer 114 may be formed of zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

In an implementation, the first metal-containing layer 126A may include nitride of Ti, nitride of Ta, oxynitride of Ti, or oxynitride of Ta. For example, the first metal-containing layer 126A may be formed of TiN, TaN, TiAlN, TaAlN, TiSiN, or a combination thereof. The first metal-containing layer 126A may be formed via various vapor deposition methods such as ALD, CVD, and PVD.

In an implementation, the second metal-containing layer 126B may be formed of an N-type metal-containing layer necessary for an NMOS transistor including an Al compound containing Ti or Ta. For example, the second metal-containing layer 126B may be formed of TiAlC, TiAlN, TiAlCN, TiAl, TaAlC, TaAlN, TaAlCN, TaAl, or a combination thereof.

In an implementation, the second metal-containing layer 126B may be formed of a P-type metal-containing layer necessary for a PMOS transistor. For example, the second metal-containing layer 126B may include at least one of Mo, Pd, Ru, Pt, TiN, WN, TaN, Ir, TaC, RuN, and MoN.

The second metal-containing layer 126B may be formed of a single layer or multiple layers.

The second metal-containing layer 126B may adjust a work function of the gate structure 120, together with the first metal-containing layer 126A. A threshold voltage of the gate structure 120 may be adjusted by work function adjustments by the first metal-containing layer 126A and the second metal-containing layer 126B. According to some embodiments, the first metal-containing layer 126A or the second metal-containing layer 126B may be omitted.

When the gate structure 120 is formed using a replacement metal gate (RMG) process, the gap-fill metal layer 128 may be formed to fill a remaining gate space on the second metal-containing layer 126B. When no gate space remains on the second metal-containing layer 126B after the second metal-containing layer 126B is formed, the gap-fill metal layer 128 may not be formed on the second metal-containing layer 126B.

The gap-fill metal layer 128 may include, for example, W, metal nitride (e.g., TiN or TaN), Al, metal carbide, metal silicide, metal aluminum carbide, metal aluminum nitride, or metal silicon nitride.

An integrated circuit (IC) device may include an FinFET having a 3D-structure channel as illustrated in FIGS. 8A-8D. In an implementation, methods of manufacturing IC devices including planar MOSFETs may be provided via various modifications and changes.

FIGS. 9A to 9F illustrate cross-sectional views of stages in a method of fabricating a semiconductor device, according to an exemplary embodiment.

Figure 9A:
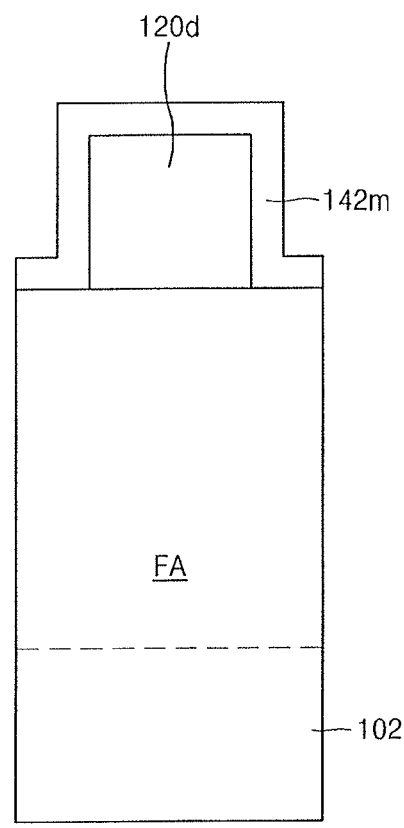
FIGS. 9A to 9F illustrate cross-sectional views of stages in a method of fabricating a semiconductor device, according to an exemplary embodiment.

Referring to FIG. 9A, after a dummy gate electrode 120d is formed on a substrate 102, a spacer material layer 142m may be conformally deposited on the substrate 102 and an entire surface of the dummy gate electrode 120d.

The substrate 102 has been described above with reference to FIGS. 8A-8C, and a repeated description of the substrate 102 may be omitted.

In an implementation, the dummy gate electrode 120d may be formed of, e.g., polysilicon. The dummy gate electrode 120d may be provided to secure a location and a space where a gate electrode is to be formed.

The spacer material layer 142m may include a SiOCN material layer. In an implementation, the spacer material layer 142m may be formed of a SiOCN single material layer. In an implementation, the spacer material layer 142m may be formed of a multi-material layer in which at least two materials layers including SiOCN are stacked.

A method of forming the SiOCN material layer has already been described above with reference to FIGS. 2-7, and thus an additional description thereof may be omitted.

Figure 9B:
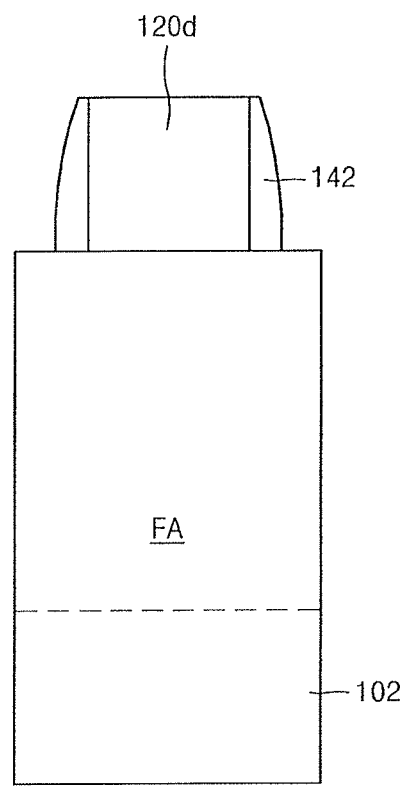

Referring to FIG. 9B, the spacer material layer 142m may be anisotropically etched to form the spacers 142. The spacers 142 may be formed on sidewalls of the dummy gate electrode 120d.

Figure 9C:
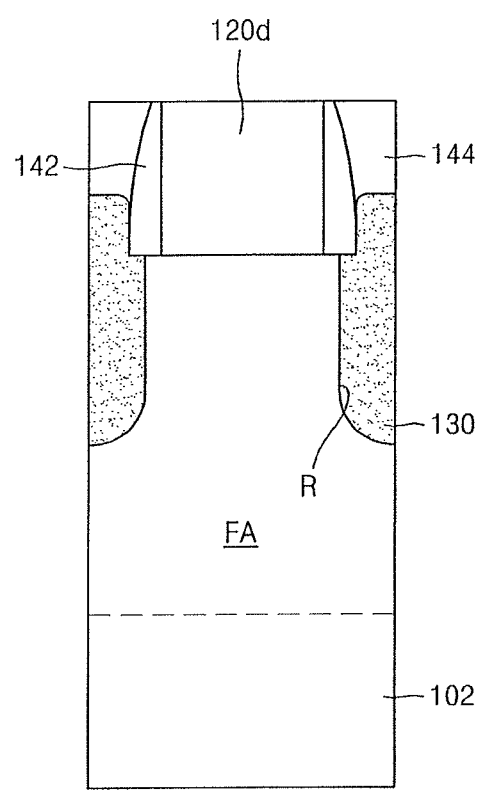

Referring to FIG. 9C, the fin-type active area FA may be partially removed by using the dummy gate electrode 120d and the spacers 142 as an etch mask.

Anisotropic etching and/or isotropic etching may be performed to partially remove the fin-type active area FA. For example, to expose at least a portion of lower surfaces of the spacers 142, anisotropic etching and isotropic etching may be combined and thus partial etching may be performed.

For example, an exposed portion of the fin-type active area FA may be anisotropically etched to a predetermined depth, and then isotropic etching may be performed by wet etching. For example, an $NH_4OH$ solution, a trimethyl ammonium hydroxide (TMAH), an HF solution, an $NH_4F$ solution, or a mixture thereof may be used as an etchant for the wet etching.

A trench may be formed by anisotropic etching using the spacers 142 as an etch mask and may undergo the wet etching to thereby obtain a recess R via which the portions of the lower surfaces of the spacers 142 are exposed as shown in FIG. 9C. For example, the recess R may expose at least portions of lower surfaces of the spacers that are on an impurity region side.

In an implementation, wet etching that is performed to expose the portions of the lower surfaces of the spacers 142 may be omitted.

Then, a source/drain material layer may be formed within the recess R to form an impurity area 130. The source/drain material layer may be formed of Si, SiC, or SiGe. The source/drain material layer may be formed by, e.g., epitaxial growth. Impurities may be injected in situ during epitaxial growth of the source/drain material layer. The impurities may be injected via ion implantation after the source/drain material layer is formed. The impurity area 130 may have an upper surface that is higher than an upper surface of the fin-type active area FA.

Then, the interlayer insulation layer 144 may be formed on the upper surface of the impurity region 130. The interlayer insulation layer 144 may be, e.g., silicon nitride.

Figure 9D:
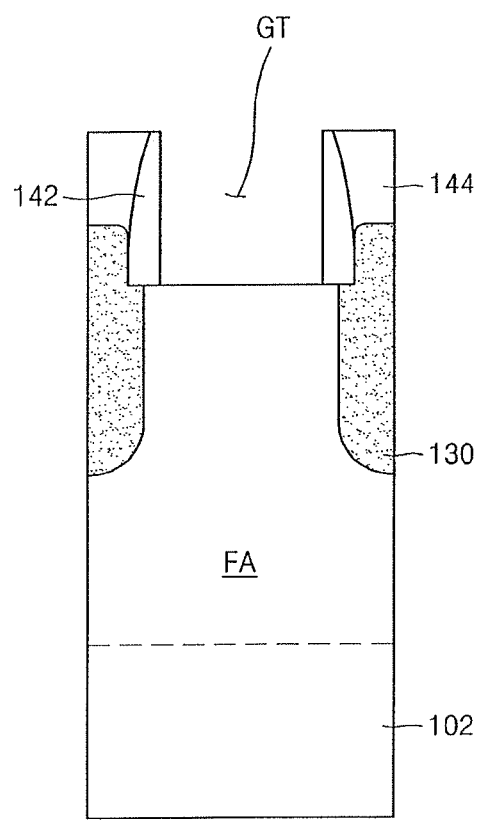

Referring to FIG. 9D, the dummy gate electrode 120d may be removed to form a gate trench GT. An upper surface of the substrate 102 may be partially exposed via the gate trench GT. The portion of the semiconductor substrate 102 exposed via the gate trench GT may correspond to a channel region of the semiconductor device that is to be fabricated later.

The dummy gate electrode 120d may be removed by, e.g., dry etching or wet etching.

Figure 9E:
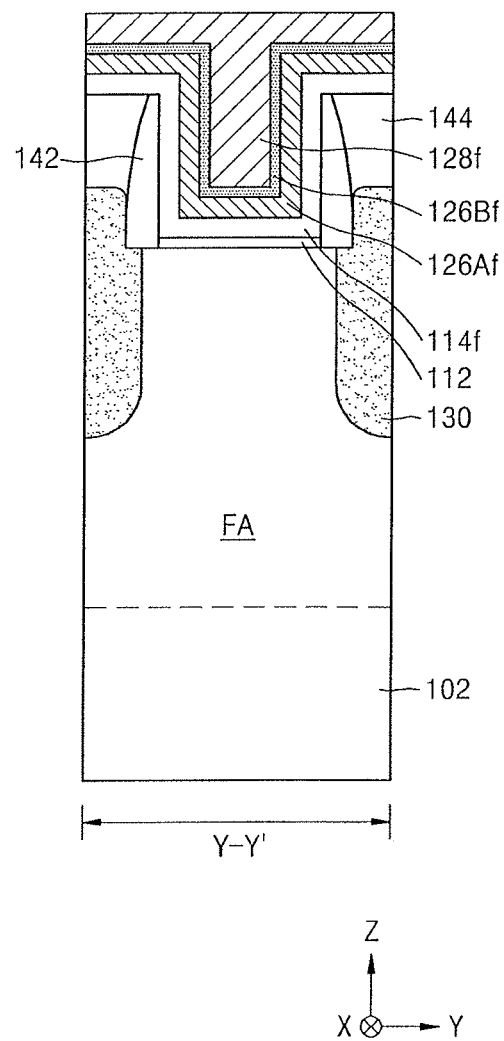

Referring to FIG. 9E, the interface layer 112 may be formed. Then, a high-dielectric constant material layer 114f, a first metal-containing material layer 126Af, a second metal-containing material layer 126Bf, and/or a gap-fill metal material layer 128f may be sequentially formed on an upper surface of the interface layer 112, the sidewalls of the gate trench GT, and the upper surface of the interlayer insulation layer 144. For example, the high-dielectric constant material layer 114f, the first metal-containing material layer 126Af, and the second metal-containing material layer 126Bf may be conformally formed along the upper surface, the sidewalls, and the upper surface. The gap-fill metal material layer 128f may be formed to fill a trench generated by the second metal-containing material layer 126Bf.

The high-dielectric constant material layer 114f, the first metal-containing material layer 126Af, the second metal-containing material layer 126Bf, and the gap-fill metal material layer 128f may be independently formed by ALD, CVD, or PVD.

Figure 9F:
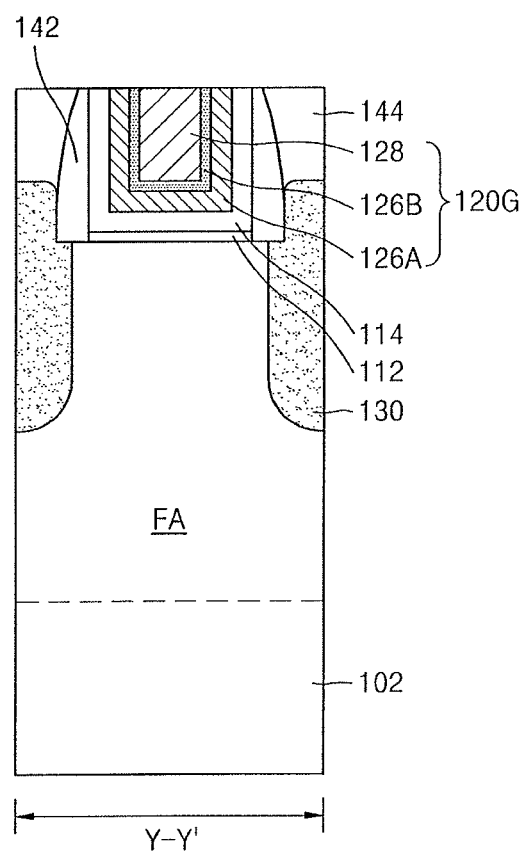

Referring to FIG. 9F, a resultant structure may be planarized until the upper surface of the interlayer insulation layer 144 is exposed, thereby obtaining a final semiconductor device 100. The planarization may be performed by, e.g., chemical mechanical polishing (CMP).

In an implementation, a source/drain region as an impurity region may have a raised source/drain (RSD) structure as illustrated in FIGS. 8A-8C and FIGS. 9A-9F. In an implementation, the impurity region 130 may be an impurity-doped region formed in an area corresponding to the fin-type active area FA.

When a material layer forming method according to an embodiment is used, a material having a high tolerance to etching and good electric characteristics may be formed even at a lower temperature.

For example, a material layer having a dielectric constant of less than 5.0, less than 4.8, or less than 4.4 may be fabricated even at 600° C. or less or 500° C. or less.

Figure 10:
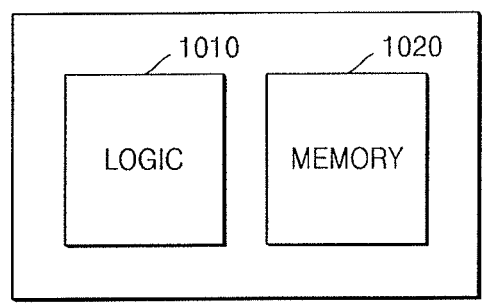
FIG. 10 illustrates a block diagram of an electronic device according to an embodiment.

FIG. 10 illustrates a block diagram of an electronic device 1000 according to an embodiment.

Referring to FIG. 10, the electronic device 1000 includes a logic region 1010 and a memory region 1020.

The logic region 1010 may include various types of logic cells including a plurality of circuit elements, such as a transistor and a register, as standard cells performing desired logical functions, such as a counter and a buffer. The logic cells may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FILL), a multiplexer (MXT/MXIT), an OR/AND/INVERTER (OAI), an AND/OR (AO), an AND/OR/INVERTER (AOI), a D flip-flop, a reset flip-flop, a master-slaver flip-flop, or a latch.

The memory region 1020 may include at least one of SRAM, DRAM, MRAM, RRAM, and PRAM.

At least one of the logic region 1010 and the memory region 1020 may include at least one selected from the semiconductor devices 100 including the SiOCN material layer described above with reference to FIGS. 2-9E as a spacer and IC devices having various structures modified and changed from the semiconductor devices 100.

Figure 11:
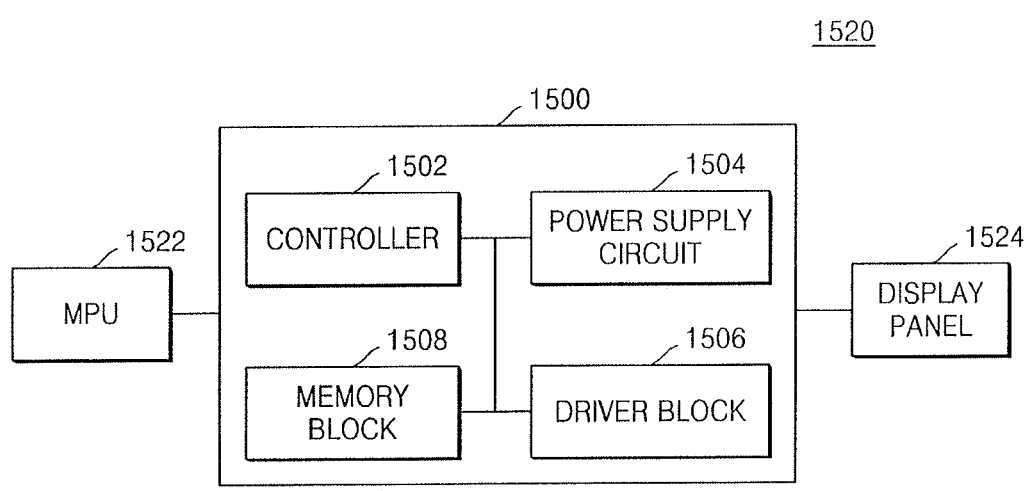
FIG. 11 illustrates a block diagram of a display device including a display driving integrated circuit (DDI), according to an embodiment.

FIG. 11 illustrates a schematic block diagram of a display driver IC (DDI) 1500 and a display device 1520 including the DDI 1500, according to an embodiment.

Referring to FIG. 11, the DDI 1500 may include a controller 1502, a power supply circuit 1504, a driver block 1506, and a memory block 1508. The controller 1502 receives and decodes a command applied by a main processing unit (MPU) 1522, and controls the blocks of the DDI 1500 to accomplish an operation corresponding to the command. The power supply circuit 1504 generates a driving voltage in response to a control of the controller 1502. The driver block 1506 drives a display panel 1524 by using the driving voltage generated by the power supply circuit 1504, in response to a control of the controller 1502. The display panel 1524 may be liquid crystal display panel or a plasma display panel. The memory block 1508 temporarily stores a command input to the controller 1502 or control signals output by the controller 1502, or stores pieces of necessary data. The memory block 1508 may include memory such as RAM or ROM. At least one of the power supply circuit 1504 and the driver block 1506 may include at least one selected from the semiconductor devices 100 including the SiOCN material layer described above with reference to FIGS. 2-9E as a spacer and IC devices having various structures modified and changed from the semiconductor devices 100.

Figure 12:
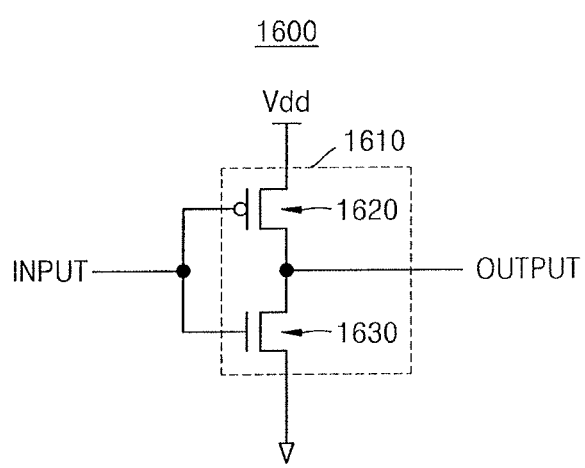
FIG. 12 illustrates a circuit diagram of a CMOS inverter according to an embodiment.

FIG. 12 illustrates a circuit diagram of a CMOS inverter 1600 according to an embodiment.

The CMOS inverter 1600 includes a CMOS transistor 1610. The CMOS transistor 1610 includes a PMOS transistor 1620 and an NMOS transistor 1630 connected between a power supply terminal Vdd and a ground terminal. The CMOS transistor 1610 may include at least one selected from the semiconductor devices 100 including the SiOCN material layer described above with reference to FIGS. 2-9E as a spacer and IC devices having various structures modified and changed from the semiconductor devices 100.

Figure 13:
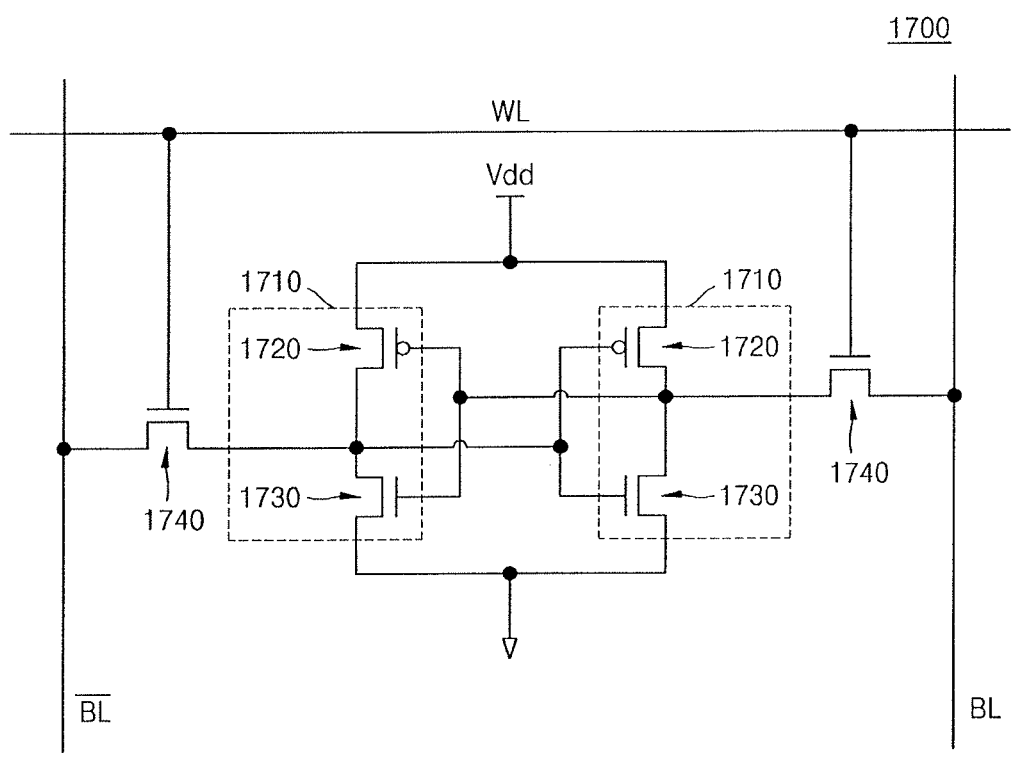
FIG. 13 illustrates a circuit diagram of a CMOS SRAM according to an embodiment.

FIG. 13 illustrates a circuit diagram of a CMOS SRAM 1700 according to an embodiment.

The CMOS SRAM 1700 includes a pair of driving transistors 1710. Each of the two driving transistors 1710 includes a PMOS transistor 1720 and an NMOS transistor 1730 connected between a power supply terminal Vdd and a ground terminal. The CMOS SRAM 1700 further includes a pair of transmission transistors 1740. Sources of the transmission transistors 1740 are cross-connected to common nodes of the PMOS transistors 1720 and the NMOS transistors 1730, which constitute the driving transistors 1710. The power supply terminal Vdd is connected to sources of the PMOS transistors 1720, and the ground terminal is connected to sources of the NMOS transistors 1730. A word line WL is connected to gates of the transmission transistors 1740, and a bit line BL and an inverted bit line are connected to drains of the transmission transistors 1740, respectively.

At least one of the driving transistors 1710 and the transmission transistors 1740 of the CMOS SRAM 1700 may include at least one selected from the semiconductor devices 100 including the SiOCN material layer described above with reference to FIGS. 2-9E as a spacer and IC devices having various structures modified and changed from the semiconductor devices 100.

Figure 14:
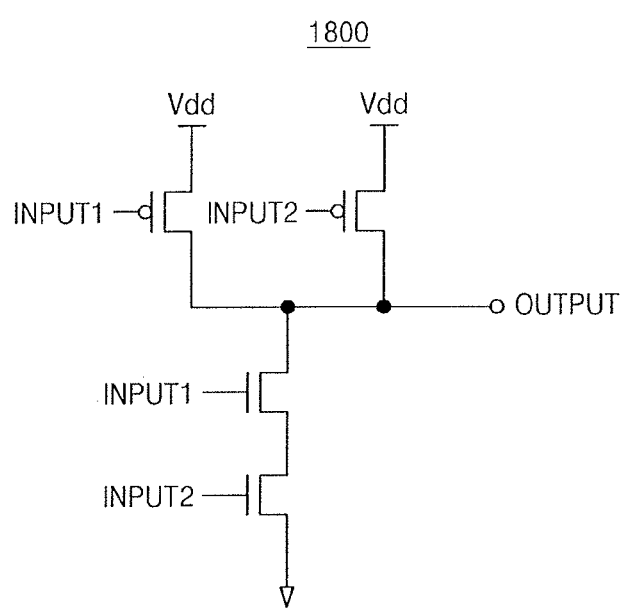
FIG. 14 illustrates a circuit diagram of a CMOS NAND circuit according to an embodiment.

FIG. 14 illustrates a circuit diagram of a CMOS NAND circuit 1800 according to an embodiment.

The CMOS NAND circuit 1800 includes a pair of CMOS transistors to which different input signals are transmitted. The CMOS NAND circuit 1800 may include at least one selected from the semiconductor devices 100 including the SiOCN material layer described above with reference to FIGS. 2-9E as a spacer and IC devices having various structures modified and changed from the semiconductor devices 100.

Figure 15:
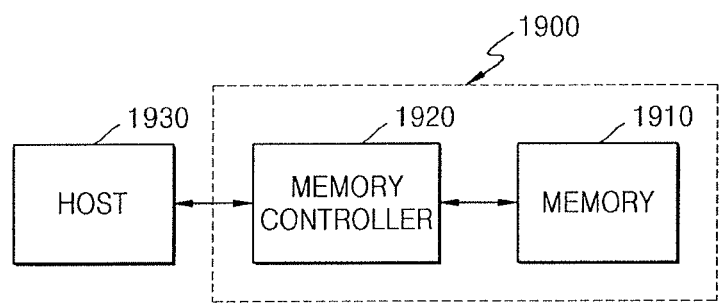
FIG. 15 illustrates a block diagram of an electronic system according to an embodiment.

FIG. 15 illustrates a block diagram of an electronic system 1900 according to an embodiment.

The electronic system 1900 includes a memory 1910 and a memory controller 1920. The memory controller 1920 controls the memory 1910 to perform data readout from and/or data writing to the memory 1910 in response to a request of a host 1930. At least one of the memory 1910 and the memory controller 1920 may include at least one selected from the semiconductor devices 100 including the SiOCN material layer described above with reference to FIGS. 2-9E as a spacer and IC devices having various structures modified and changed from the semiconductor devices 100.

Figure 16:
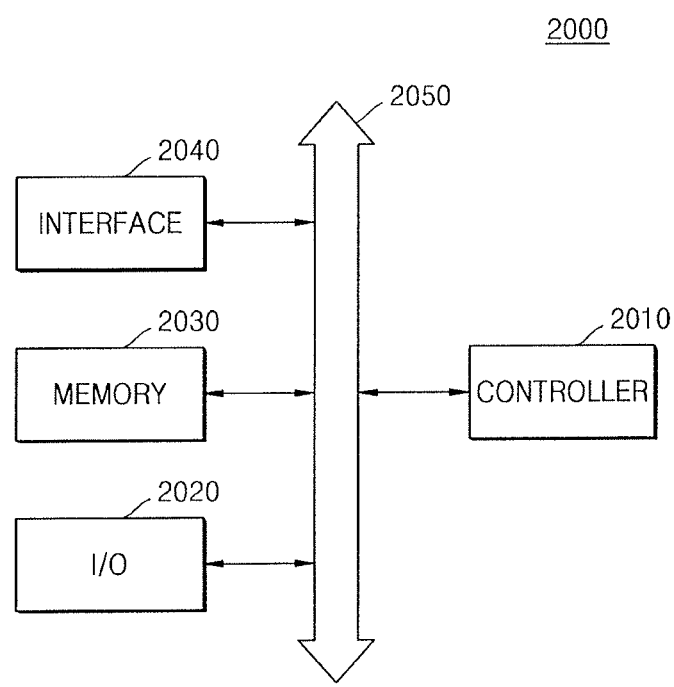
FIG. 16 illustrates a block diagram of an electronic system according to an embodiment.

FIG. 16 illustrates a block diagram of an electronic system 2000 according to an embodiment.

The electronic system 2000 includes a controller 2010, an input/output (I/O) device 2020, a memory 2030, and an interface 2040, which are connected to one another via a bus 2050.

The controller 2010 may include at least one of a microprocessor, a digital signal processor, and a processing device that is similar to these devices. The I/O device 2020 may include at least one of a keypad, a keyboard, and a display. The memory 2030 may store commands executed by the controller 2010. For example, the memory 2030 may store user data.

The electronic system 2000 may form a wireless communication device, or a device capable of transmitting and/or receiving information under wireless environments. The interface 2040 may be implemented by a wireless interface in order to help the electronic system 2000 to transmit/receive data via a wireless communication network. The interface 2040 may include an antenna and/or a wireless transceiver. According to some embodiments, the electronic system 2000 may be used in a communication interface protocol of a third-generation communication system, for example, code division multiple access (CDMA), a global system for mobile communications (GSM), north American digital cellular (NADC), extended-time division multiple access (E-TDMA), and/or wide band code division multiple access (WCDMA). The electronic system 2000 may include at least one selected from the semiconductor devices 100 including the SiOCN material layer described above with reference to FIGS. 2-9E as a spacer and IC devices having various structures modified and changed from the semiconductor devices 100.

By way of summation and review, when a material layer is formed at a low temperature, the material layer may not have desired physical properties. For example, when a spacer in a logic device is formed at a low temperature, electric characteristics or a physical property (e.g., etching resistance) may not be at a desired level. Accordingly, a method of forming a material layer having a desired physical property even at a low temperature may be desirable.

The embodiments may provide a material layer having high etching resistance and good electric characteristics even at a low temperature.

The embodiments may provide a method of forming a SiOCN material layer having a high tolerance to etching and good electrical characteristics.

The embodiments may provide a material layer stack having a high tolerance to etching and good electrical characteristics.

The embodiments may provide a semiconductor device including a material layer stack having a high tolerance to etching and good electrical characteristics.

The embodiments may provide a method of fabricating a semiconductor device including a material layer stack having a high tolerance to etching and good electrical characteristics.

The embodiments may provide a deposition apparatus capable of forming a SiOCN material layer having a high tolerance to etching and good electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a SiOCN material layer, the method comprising:
 providing a substrate;
 providing a silicon precursor onto the substrate;
 providing an oxygen reactant onto the substrate;
 providing a first carbon precursor onto the substrate;
 providing a second carbon precursor onto the substrate; and
 providing a nitrogen reactant onto the substrate,
 wherein the first carbon precursor and the second carbon precursor are different materials,
 wherein the first carbon precursor includes an alkylsilane having a carbon number of 1 to 20, an alkoxysilane having a carbon number of 1 to 20, or an alkylsiloxane having a carbon number of 1 to 20, wherein the second carbon precursor includes:
an alkylamine having a carbon number of 1 to 15 or a nitrogen-containing heterocyclic compound having a carbon number of 4 to 15; or
an alkylsilane having a carbon number of 1 to 20, an alkoxysilane having a carbon number of 1 to 20, or an alkylsiloxane having a carbon number of 1 to 20, and
wherein the nitrogen reactant and the second carbon precursor are the same material, and providing the nitrogen reactant and providing the second carbon precursor are performed simultaneously, and
wherein the method is performed at 600° C. or less.

2. The method as claimed in claim 1, wherein providing the silicon precursor, providing the oxygen reactant, providing the first carbon precursor, and providing the second carbon precursor are included in a single cycle.

3. The method as claimed in claim 1, wherein:
the second carbon precursor includes an alkylamine having a carbon number of 1 to 15 or a nitrogen-containing heterocyclic compound having a carbon number of 4 to 15.

4. The method as claimed in claim 1, wherein:
the silicon precursor and the first carbon precursor include the same material, and
providing the silicon precursor and providing the first carbon precursor are performed simultaneously.

5. The method as claimed in claim 4, wherein providing the first carbon precursor, providing the oxygen reactant, and providing the second carbon precursor are included in a single cycle.

6. The method as claimed in claim 4, wherein the method is performed at 500° C. or less.

7. A method of forming a SiOCN material layer, the method comprising:
providing a substrate;
providing a silicon precursor onto the substrate;
providing an oxygen reactant onto the substrate;
providing a first carbon precursor onto the substrate;
providing a second carbon precursor onto the substrate; and
providing a nitrogen reactant onto the substrate,
wherein the first carbon precursor and the second carbon precursor are different materials, and
wherein at least one of the first carbon precursor and the second carbon precursor includes:
an alkylamine having a carbon number of 1 to 15 or a nitrogen-containing heterocyclic compound having a carbon number of 4 to 15; or
an alkylsilane having a carbon number of 1 to 20, an alkoxysilane having a carbon number of 1 to 20, or an alkylsiloxane having a carbon number of 1 to 20, and
wherein the silicon precursor and the second carbon precursor are the same material, and providing the silicon precursor and providing the second carbon precursor are performed simultaneously, and
wherein the method is performed at 600° C. or less.

8. The method as claimed in claim 7, wherein providing the silicon precursor, providing the oxygen reactant, providing the first carbon precursor, and providing the nitrogen reactant are included in a single cycle.

9. The method as claimed in claim 7, wherein:
the first carbon precursor includes an alkane having a carbon number of 1 to 10, an alkene having a carbon number of 2 to 10, an alkylamine having a carbon number of 1 to 15, or a nitrogen-containing heterocyclic compound having a carbon number of 4 to 15, and
the second carbon precursor includes an alkylsilane having a carbon number of 1 to 20, an alkoxysilane having a carbon number of 1 to 20, or an alkylsiloxane having a carbon number of 1 to 20.

10. The method as claimed in claim 9, wherein the first carbon precursor includes an alkylamine having a carbon number of 1 to 15, or a nitrogen-containing heterocyclic compound having a carbon number of 4 to 15.

11. The method as claimed in claim 7, wherein time period of providing a first carbon precursor onto the substrate at least partially overlaps with time period of providing a second carbon precursor onto the substrate.

12. The method as claimed in claim 11, wherein the time period of providing a first carbon precursor onto the substrate starts before the time period of providing a second carbon precursor onto the substrate starts.

13. The method as claimed in claim 12, wherein the time period of providing a first carbon precursor onto the substrate ends after the time period of providing a second carbon precursor onto the substrate ends.

14. The method as claimed in claim 12, wherein the time period of providing a first carbon precursor onto the substrate ends before the time period of providing a second carbon precursor onto the substrate ends.

15. A method of forming a SiOCN material layer, the method comprising:
providing a substrate;
providing a silicon precursor onto the substrate;
providing an oxygen reactant onto the substrate;
providing a first carbon precursor onto the substrate; and
providing a second carbon precursor onto the substrate;
wherein the first carbon precursor and the second carbon precursor are different materials, and
wherein at least one of the first carbon precursor and the second carbon precursor includes:
an alkylamine having a carbon number of 1 to 15 or a nitrogen-containing heterocyclic compound having a carbon number of 4 to 15; or
an alkylsilane having a carbon number of 1 to 20, an alkoxysilane having a carbon number of 1 to 20, or an alkylsiloxane having a carbon number of 1 to 20, and
wherein the silicon precursor and the second carbon precursor are the same material, and providing the silicon precursor and providing the second carbon precursor are performed simultaneously, and
wherein the method is performed at 600° C. or less.

16. The method as claimed in claim 15, wherein:
the first carbon precursor includes an alkane having a carbon number of 1 to 10, an alkene having a carbon number of 2 to 10, an alkylamine having a carbon number of 1 to 15, or a nitrogen-containing heterocyclic compound having a carbon number of 4 to 15, and
the second carbon precursor includes an alkylsilane having a carbon number of 1 to 20, an alkoxysilane having a carbon number of 1 to 20, or an alkylsiloxane having a carbon number of 1 to 20.

17. The method as claimed in claim 16, wherein the first carbon precursor includes an alkylamine having a carbon number of 1 to 15, or a nitrogen-containing heterocyclic compound having a carbon number of 4 to 15.

18. A method of fabricating a semiconductor device, the method comprising:
defining a fin-type active area that protrudes from a semiconductor substrate and extends in a first direction;

forming a gate electrode that covers two sidewalls and an upper surface of the fin-type active area, the gate electrode extending in a direction that intersects the first direction;

forming a spacer on a sidewall of the gate electrode such that the spacer including a SiOCN material layer; and forming impurity regions in the fin-type active area respectively on opposite sides of the gate electrode, wherein forming the spacer includes:

providing a silicon precursor onto the gate electrode;

providing an oxygen reactant onto the gate electrode;

providing a first carbon precursor onto the gate electrode;

providing a second carbon precursor onto the gate electrode; and providing a nitrogen reactant onto the gate electrode, wherein the first carbon precursor and the second carbon precursor are different materials, wherein the first carbon precursor includes an alkylsilane having a carbon number of 1 to 20, an alkoxysilane having a carbon number of 1 to 20, or an alkylsiloxane having a carbon number of 1 to 20, wherein the second carbon precursor includes:

an alkylamine having a carbon number of 1 to 15 or a nitrogen-containing heterocyclic compound having a carbon number of 4 to 15; or an alkylsilane having a carbon number of 1 to 20, an alkoxysilane having a carbon number of 1 to 20, or an alkylsiloxane having a carbon number of 1 to 20, and wherein the nitrogen reactant and the second carbon precursor are the same material, and providing the nitrogen reactant and providing the second carbon precursor are performed simultaneously, and wherein the method is performed at 600° C. or less.

* * * * *